US008318587B2

(12) United States Patent  (10) Patent No.: US 8,318,587 B2
Shimomura et al.  (45) Date of Patent: Nov. 27, 2012

(54) METHOD FOR MANUFACTURING SEMICONDUCTOR DEVICE

(75) Inventors: Akihisa Shimomura, Atsugi (JP); Masaki Koyama, Atsugi (JP); Toru Hasegawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 109 days.

(21) Appl. No.: 12/872,213

(22) Filed: Aug. 31, 2010

(65) Prior Publication Data

US 2011/0053347 A1  Mar. 3, 2011

(30) Foreign Application Priority Data

Sep. 2, 2009 (JP) ................................. 2009-202281

(51) Int. Cl.
*H01L 21/46* (2006.01)
*H01L 21/30* (2006.01)
*H01L 21/36* (2006.01)
*H01L 21/763* (2006.01)

(52) U.S. Cl. .................... 438/458; 438/480; 438/455

(58) Field of Classification Search .................. 438/455, 438/458, 480
See application file for complete search history.

(56) References Cited

U.S. PATENT DOCUMENTS

| | | | |
|---|---|---|---|
| 5,550,070 A * | 8/1996 | Funai et al. | 438/486 |
| 7,119,365 B2 | 10/2006 | Takafuji et al. | |
| 7,148,093 B2 * | 12/2006 | Makita | 438/166 |
| 7,619,250 B2 | 11/2009 | Takafuji et al. | |
| 7,763,502 B2 | 7/2010 | Kakehata et al. | |
| 7,892,951 B2 * | 2/2011 | Landru et al. | 438/480 |
| 2005/0221545 A1 * | 10/2005 | Kokubo et al. | 438/151 |
| 2008/0308897 A1 | 12/2008 | Kakehata et al. | |
| 2009/0017568 A1 | 1/2009 | Kakehata | |
| 2009/0098710 A1 | 4/2009 | Yamazaki | |
| 2009/0111243 A1 | 4/2009 | Landru et al. | |
| 2009/0170287 A1 | 7/2009 | Endo et al. | |
| 2009/0197391 A1 | 8/2009 | Ohnuma et al. | |
| 2009/0325363 A1 | 12/2009 | Ohnuma et al. | |
| 2009/0325364 A1 | 12/2009 | Sasagawa et al. | |
| 2010/0019242 A1 | 1/2010 | Takafuji et al. | |
| 2010/0047997 A1 | 2/2010 | Ishizuka et al. | |

FOREIGN PATENT DOCUMENTS

| | | |
|---|---|---|
| JP | 2004-087606 | 3/2004 |
| JP | 2005-252244 | 9/2005 |
| JP | 2009-111381 | 5/2009 |

* cited by examiner

*Primary Examiner* — Luan C Thai
(74) *Attorney, Agent, or Firm* — Eric J. Robinson; Robinson Intellectual Property Law Office, P.C.

(57) ABSTRACT

It is an object to provide a method for manufacturing an SOI substrate in which reduction in yield can be suppressed while impurity diffusion into a semiconductor film is suppressed. A semiconductor substrate provided with an oxide film is formed by thermally oxidizing the surface of the semiconductor substrate. Plasma is generated under an atmosphere of a gas containing nitrogen atoms and plasma nitridation is performed on part of the oxide film, so that a semiconductor substrate in which an insulating film containing nitrogen atoms is formed over the oxide film is obtained. After bonding the insulating film containing nitrogen atoms and a glass substrate to each other, the semiconductor substrate is split, whereby an SOI substrate in which the insulating film containing nitrogen atoms, the oxide film, a thin semiconductor film are stacked in this order is formed.

28 Claims, 13 Drawing Sheets

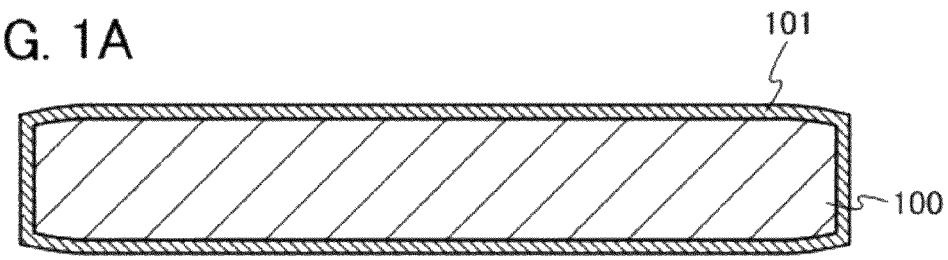
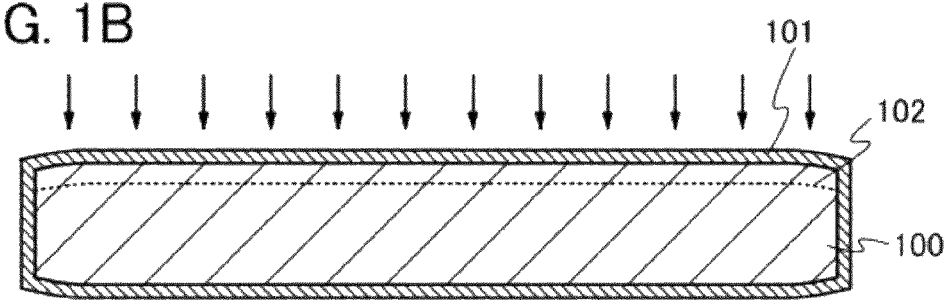
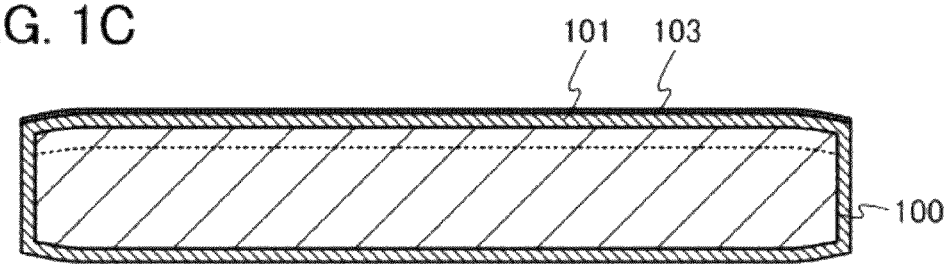
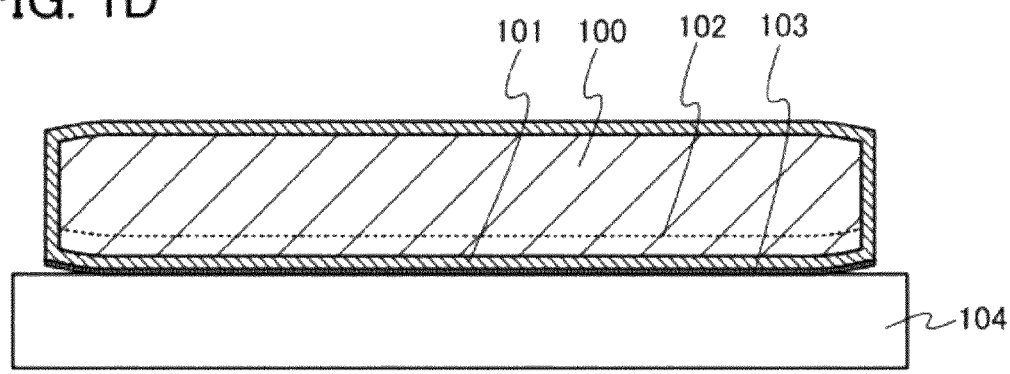

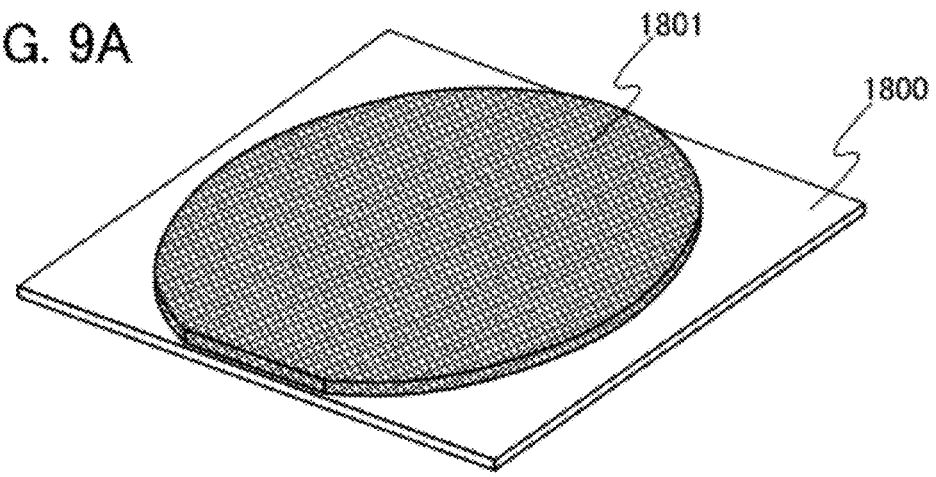
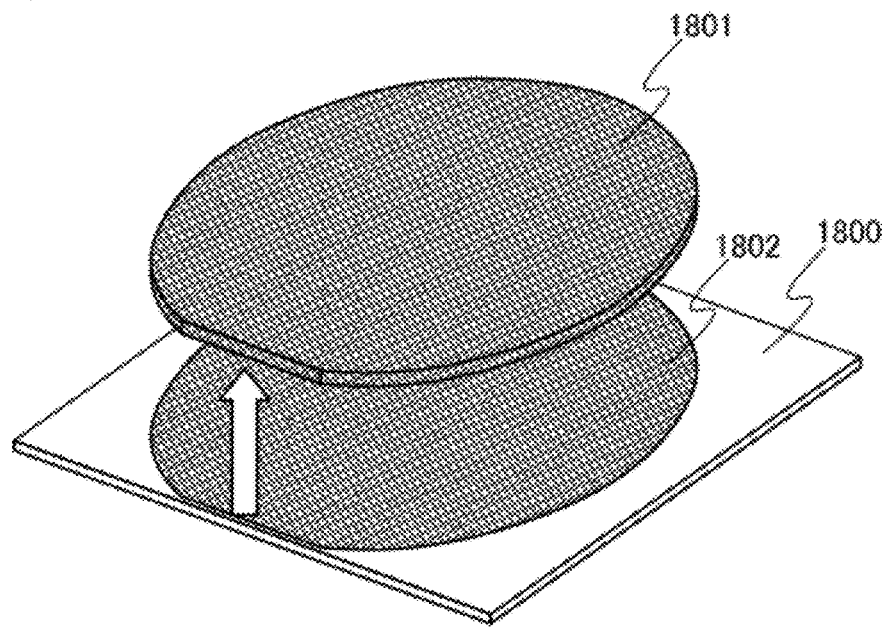

METHOD FOR MANUFACTURING SEMICONDUCTOR DEVICE

BACKGROUND OF THE INVENTION

1. Field of the Invention

The present invention relates to a method for manufacturing a semiconductor device using a silicon-on-insulator (SOI) substrate.

2. Description of the Related Art

Demands for higher integration, higher operation speed, higher performance, and lower power consumption of a semiconductor integrated circuit have been more stringent, and in response to such demands, a transistor using an SOI substrate has attracted attention as an effective means that can take the place of a bulk transistor. Higher operation speed and lower power consumption of a semiconductor device can be expected more in the transistor using the SOI substrate than in the bulk transistor because a semiconductor film is formed over an insulating film in the transistor using the SOI substrate, and accordingly parasitic capacitance can be reduced and generation of leakage current flowing through the substrate can be suppressed. In addition, since the semiconductor film used as an active layer can be formed thin, a short channel effect can be suppressed; thus, an element can be miniaturized and higher integration of a semiconductor integrated circuit can be realized accordingly.

As one method for manufacturing an SOI substrate, a method is given in which a semiconductor film is attached to a substrate with an insulating film interposed therebetween, such as UNIBOND (registered trademark) typified by Smart Cut (registered trademark), ELTRAN (epitaxial layer transfer), a dielectric separation method, or a PACE (plasma assisted chemical etching) method. The above-described attaching methods make it possible to form a high-performance integrated circuit using a single crystal semiconductor film over an inexpensive glass substrate.

For example, Patent Document 1 (Japanese Published Patent Application No. 2004-087606) has disclosed a method for manufacturing an SOI substrate by attaching a semiconductor film separated from a bulk semiconductor substrate to a glass substrate.

In Patent Document 2, a method for improving crystallinity of a semiconductor thin film layer transferred to a glass substrate by laser light irradiation is disclosed.

REFERENCE

Patent Document

[Patent Document 1] Japanese Published Patent Application No. 2004-087606
[Patent Document 2] Japanese Published Patent Application No. 2005-252244

SUMMARY OF THE INVENTION

An SOI substrate using the above-described glass substrate has advantages in that it is less expensive than an SOI substrate using a semiconductor substrate and increase in area of a semiconductor device can be easily realized. However, in the case where an SOI substrate is formed using a glass substrate, there is a possibility that a metal such as Cu, an alkali metal, or an alkaline earth metal contained in the glass substrate diffuses into a semiconductor film. In particular, when laser light irradiation is performed in order to improve the crystallinity of the semiconductor film which is damaged in a separation step, the above metal contained in the glass substrate significantly diffuses into the semiconductor film.

It is known that if there is a metal such as Cu or Fe on the surface of the semiconductor film, characteristics of a semiconductor element such as increase in off current of the thin film transistor are adversely affected. However, these metals diffused into the semiconductor film are difficult to easily remove by cleaning.

It is effective to use an insulating film containing nitrogen as the insulating film formed between the glass substrate and the semiconductor film so that impurities such as the above metals are prevented from diffusing into the semiconductor film. However, in the case where an insulating film containing nitrogen is used, dust is easily generated in forming the above insulating film by an evaporation method such as a CVD method or a sputtering method. When dust enters a bonding interface, bonding is not performed in a region where the dust exists, so that the semiconductor film is partly chipped after the separation. Therefore, dust generated in forming the insulating film is one of the reasons for reduction in yield in manufacturing an SOI substrate.

In view of the above-described problems, it is an object of the present invention to provide a method for manufacturing an SOI substrate in which reduction in yield can be suppressed while impurity diffusion into a semiconductor film is suppressed. In addition, it is an object of the present invention to provide a method for manufacturing a semiconductor device in which reduction in yield can be suppressed while deterioration in characteristics of the semiconductor element is suppressed.

In order to solve the above problems, a semiconductor substrate provided with an oxide film is formed by thermally oxidizing the surface of the semiconductor substrate. Plasma is generated under an atmosphere of a gas containing nitrogen atoms and plasma nitridation is performed on part of the oxide film, so that a semiconductor substrate in which an insulating film containing nitrogen atoms is formed over the oxide film is obtained. After bonding the insulating film containing nitrogen atoms and a glass substrate to each other, the semiconductor substrate is split, whereby an SOI substrate in which the insulating film containing nitrogen atoms, the oxide film, a thin semiconductor film are stacked in this order is formed.

The thin semiconductor film can be separated from the semiconductor substrate by heat treatment after an embrittlement region where the crystal is damaged and embrittled is formed at a predetermined depth in the semiconductor substrate by implantation of ions into the semiconductor substrate. The embrittlement region can be formed after the formation of the oxide film by thermal oxidation and before or after the formation of the insulating film containing nitrogen by the plasma nitridation.

As a gas containing nitrogen atoms, ammonia, nitrogen, a nitrogen oxide, or the like can be used. A rare gas such as helium, argon, krypton, or xenon, hydrogen, or the like may be used together with the above-described gas containing nitrogen atoms.

The insulating film containing nitrogen tends to have a higher internal stress as compared with the oxide film such as silicon oxide. Therefore, when the distance between the insulating film containing nitrogen and the thin semiconductor film formed by the separation is too short, the semiconductor film is adversely affected by the internal stress of the insulating film containing nitrogen. Accordingly, deterioration of characteristics of a semiconductor element formed using the semiconductor film may occur, for example, threshold voltage of the thin film transistor shifts. In an embodiment of the present invention, the thickness of the oxide film formed by thermal oxidation is set in the range of 50 nm to 1100 nm, preferably, in the range of 100 nm to 300 nm in order to keep a distance between the insulating film containing nitrogen and the semiconductor film.

In addition, deposition rate at the time of forming the insulating film containing nitrogen by plasma nitridation generally tends to be low in comparison with the case where an evaporation method such as a CVD method is employed. However, when the insulating film containing nitrogen formed by plasma nitridation has a thickness of at least 3 nm or more, the insulating film containing nitrogen has an effect of preventing impurities such as metal from diffusing into the semiconductor film. Such a thickness does not need a long treatment time for plasma nitridation. Specifically, the thickness of the insulating film containing nitrogen is 3 nm to 20 nm, preferably, 3 nm to 5 nm.

After the above SOI substrate is formed, the thin semiconductor film is processed into a desired shape by etching or the like, whereby an island-shape semiconductor film is formed. A variety of semiconductor elements such as a thin film transistor, a diode, a resistor, and a capacitor are formed using this island-shape semiconductor film, so that a semiconductor device can be manufactured.

With the above structure, a method for manufacturing an SOI substrate in which reduction in yield can be suppressed while impurity diffusion into a semiconductor film is suppressed can be provided. In addition, with the above structure, a method for manufacturing a semiconductor device in which reduction in yield can be suppressed while deterioration in characteristics of a semiconductor element is suppressed can be provided.

BRIEF DESCRIPTION OF THE DRAWINGS

In the accompanying drawings:

FIGS. 1A to 1D are diagrams illustrating a manufacturing method according to an embodiment of the present invention;

FIGS. 9A and 9B are diagrams illustrating a manufacturing method according to an embodiment of the present invention;

DETAILED DESCRIPTION OF THE INVENTION

Figure 2A:
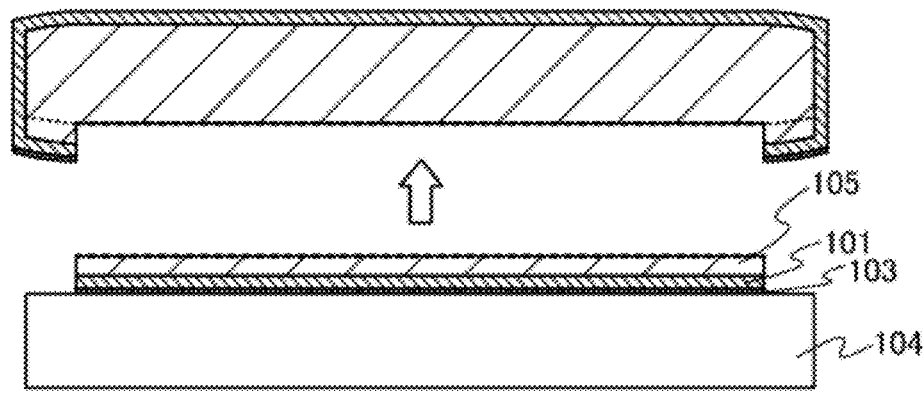
FIGS. 2A to 2D are diagrams illustrating a manufacturing method according to an embodiment of the present invention.

Embodiments of the present invention will be hereinafter described in detail with reference to the accompanying drawings. Note that the present invention is not limited to the description below, and those skilled in the art will appreciate that a variety of modifications can be made to the modes and details without departing from the spirit and scope of the present invention. Therefore, the present invention is not construed as being limited to description of the embodiments below.

The present invention can be applied to manufacture of any kind of semiconductor devices including microprocessors, integrated circuits such as image processing circuits, RF tags, and semiconductor display devices. The semiconductor display device includes in its category, a liquid crystal display device, a light-emitting device provided with a light-emitting element typified by an organic light-emitting diode (an OLED) in each pixel, a DMD (a digital micromirror device), a PDP (a plasma display panel), an FED (a field emission display), and the like, and also includes another semiconductor display device having a circuit element using a semiconductor film in a driver circuit.

Embodiment 1

In this embodiment, methods for manufacturing an SOI substrate and a semiconductor device according to an embodiment of the present invention will be described.

As illustrated in FIG. 1A, a bond substrate 100 is cleaned and then an oxide film 101 is formed over the bond substrate 100.

As the bond substrate 100, a single crystal semiconductor substrate formed using silicon, germanium, or the like can be used. Alternatively, a single crystal semiconductor substrate formed using a compound semiconductor such as gallium arsenide or indium phosphide can be used as the bond substrate 100. Further alternatively, a semiconductor substrate formed using silicon having crystal lattice distortion, silicon germanium in which germanium is added to silicon, or the like may be used as the bond substrate 100.

Note that in a single crystal semiconductor substrate used for the bond substrate 100, the directions of crystal axes are preferably uniform; however, the substrate is not necessarily formed using perfect crystals in which a lattice defect such as a point defect, a line defect, or a plane defect is completely eliminated.

In addition, the shape of the bond substrate 100 is not limited to a circle, and the substrate can be processed into a shape other than a circle. For example, in consideration of the facts that the shape of the base substrate 104 to which the bond substrate 100 is attached later is generally a rectangle and a light exposure region of a light exposure apparatus such as a reduced projection exposure apparatus is rectangular, and the like, the bond substrate 100 may be processed into a rectangular shape. The bond substrate 100 can be processed by cutting a circular single crystal semiconductor substrate available in the market.

The oxide film 101 is formed by thermal oxidation of a surface of the bond substrate 100. Thermal oxidation can be performed with the use of dry oxidation using oxygen having a small amount of moisture, thermal oxidation in which a gas containing halogen such as hydrogen chloride is added to an oxygen atmosphere, or the like. Alternatively, wet oxidation such as pyrogenic oxidation in which hydrogen is burnt with oxygen to generate water or steam oxidation using steam in which high-purity water is heated to 100° C. or higher may be used to form the oxide film 101. When wet oxidation is employed, a deposition rate of the oxide film can be increased in comparison with dry oxidation using oxygen and thermal oxidation in which a gas containing halogen such as hydrogen chloride is added to an oxygen atmosphere which are described above because water molecules are diffused into the oxide film faster than oxygen molecules.

Further, when thermal oxidation in which a gas containing halogen such as hydrogen chloride is added to an oxygen atmosphere is employed, the deposition rate of the oxide film can be more increased than when dry oxidation using oxygen is employed. As a gas containing halogen, in addition to hydrogen chloride, one or more of hydrogen fluoride, nitrogen fluoride, hydrogen bromide, chlorine, chlorine fluoride, boron chloride, fluorine, bromine and the like can be used. Note that when a heavy metal is contained in a semiconductor film, in performing heat treatment on the semiconductor film, a crystal defect such as a stacking fault is easily formed in the semiconductor film due to the heavy metal. Thermal oxidation in which a gas containing halogen is added has an effect of gettering a heavy metal because the heavy metal such as Cu in the semiconductor film become halide having high vapor pressure by reaction with halogen atoms and are desorbed from a bond substrate. Therefore, contamination of the semiconductor film by the heavy metal is prevented and, in addition, a crystal defect due to thermal oxidation can be prevented from being formed. Moreover, since a dangling bond on and near the interface with the oxide film of the bond substrate can be terminated with a hydrogen atom, the interface state density can be reduced.

For example, heat treatment is performed at 700° C. or higher in an atmosphere containing hydrogen chloride at 0.5 volume % to 10 volume % (preferably, 3 volume %) with respect to oxygen. The thermal oxidation is preferably performed at a temperature in the range of 950° C. to 1100° C. inclusive. The process time may be in the range of 0.1 to 6 hours, preferably 0.5 to 1 hour. The thickness of the oxide film 101 to be formed is preferably set in the range of 50 nm to 1100 nm (preferably, 100 nm to 300 nm) so that internal stress of an insulating film containing nitrogen atoms to be formed later is prevented from affecting the semiconductor film formed over the oxide film 101. In this embodiment, for example, heat treatment is performed at 950° C. for 200 minutes in an atmosphere containing hydrogen chloride at 3 volume % with respect to oxygen, whereby silicon oxide with a thickness of 100 nm is formed, which is used as the oxide film 101.

By this thermal oxidation treatment performed in the halogen-containing atmosphere, the oxide film can include the halogen. When the oxide film 101 includes the halogen element at a concentration of $1 \times 10^{17}$ atoms/cm$^3$ to $5 \times 10^{20}$ atoms/cm$^3$, the oxide film captures impurities such as metal; therefore, the contamination of the semiconductor film to be formed later can be prevented.

Next, as shown in FIG. 1B, the bond substrate 100 is irradiated with an ion beam including ions accelerated by an electric field through the oxide film 101 as indicated by arrows, whereby the embrittlement layer 102 having microvoids is formed in a region at a predetermined depth from a surface of the bond substrate 100. For example, the embrittlement layer means a layer which is locally embrittled by disorder of the crystal structure, and the state thereof depends on a method for forming the embrittlement layer. Note that there may be a case where a region ranging from one surface of the bond substrate to the embrittlement layer is embrittled to some extent; however, the embrittlement layer in this specification refers to a region at which separation is performed later and its vicinity.

The depth at which the embrittlement layer 102 is formed can be adjusted by the acceleration energy of the ion beam and the incident angle thereof. The acceleration energy can be adjusted by acceleration voltage or the like. The embrittlement layer 102 is formed at the same depth or substantially the same depth as the average penetration depth of the ions. The thickness of a semiconductor film 105 which will be separated from the bond substrate 100 is determined based on the depth at which the ions are implanted. The depth at which the embrittlement layer 102 is formed can be set in the range of, for example, 50 nm to 500 nm inclusive, preferably 50 nm to 200 nm inclusive, from the surface of the bond substrate 100.

The ions are implanted to the bond substrate 100 desirably by an ion doping method in which mass separation is not performed because the cycle time can be shortened; however, the present invention may employ an ion implantation method in which mass separation is performed.

When hydrogen (H$_2$) is used for a source gas, H$^+$, H$_2^+$, and H$_3^+$ can be produced by exciting a hydrogen gas. Proportions of ion species produced from the source gas can be changed by controlling a plasma excitation method, the pressure of an atmosphere for producing plasma, the amount of supplied source gas, or the like. In the case where the ion implantation is performed by an ion doping method, it is preferable that H$_3^+$ be contained at 50% or more, more preferably at 80% or more, with respect to the total amount of H$^+$, H$_2^+$, and H$_3^+$ in the ion beam. When H$_3^+$ is contained at 80% or more, the proportion of H$_2^+$ ions contained in the ion beam gets smaller relatively, which results in lower variation in the average penetration depth of the hydrogen ions contained in the ion beam. Consequently, the ion implantation efficiency improves and the cycle time can be shortened.

Further, H$_3^+$ has larger mass than H$^+$ and H$_2^+$. When the ion beam containing a higher proportion of H$_3^+$ is compared with the ion beam containing a higher proportion of H$^+$ and H$_2^+$, the former can implant hydrogen into a shallower region of the bond substrate 100 than the latter even if the acceleration voltage at the time of doping is the same. Moreover, the former has a steep concentration distribution of hydrogen implanted into the bond substrate 100 in a thickness direction, the embrittlement layer 102 itself can be formed to be thinner.

In the case of performing ion implantation by an ion doping method with the use of a hydrogen gas, the acceleration voltage is set in the range of 10 kV to 200 kV inclusive and the dosage is set in the range of $1 \times 10^{16}$ ions/cm$^2$ to $6 \times 10^{16}$ ions/cm$^2$ inclusive. Under this condition, the embrittlement layer 102 can be formed in a region at a depth of 50 nm to 500 nm inclusive from the surface of the bond substrate 100, though depending on the ion species contained in the ion beam and its proportion, and the film thickness of the oxide film 101.

For example, in the case where the bond substrate 100 is a single crystal silicon substrate and the oxide film 101 is formed using a 100-nm-thick thermal oxide film, a semiconductor film with a thickness of approximately 140 nm can be separated from the bond substrate 100 under the condition where the flow rate of 100% hydrogen gas, which is the source gas, is 50 sccm, the beam current density is 5 μA/cm$^2$, the acceleration voltage is 50 kV, and the dosage is $2.0 \times 10^{16}$ ions/cm$^2$. Note that even if the condition at the time of adding hydrogen to the bond substrate 100 is not changed, the thickness of the oxide film 101 is made larger, whereby the thickness of the semiconductor film can be made smaller.

Helium (He) can alternatively be used as the source gas of the ion beam. Since most of the ion species produced by exciting helium are He$^+$, He$^+$ can be mainly implanted into the bond substrate 100 even by an ion doping method in which mass separation is not performed. Therefore, microvoids can be formed in the embrittlement layer 102 efficiently by an ion doping method. In the case of performing the ion implantation by an ion doping method using helium, the acceleration voltage can be set in the range of 10 kV to 200 kV inclusive and the dosage can be set in the range of $1\times10^{16}$ ions/cm$^2$ to $6\times10^{16}$ ions/cm$^2$ inclusive.

A halogen gas such as a chlorine gas (Cl$_2$ gas) or a fluorine gas (F$_2$ gas) can be used for the source gas.

In the case of performing ion implantation on the bond substrate 100 by an ion doping method, impurities existing in an ion doping apparatus are implanted together with the ions into a processing object; therefore, there is a possibility that impurities such as S, Ca, Fe, and Mo exist on and near the surface of the oxide film 101. Thus, a region on and near the surface of the oxide film 101, where the number of the impurities is considered the largest, may be removed by etching, polishing, or the like. The dry etching may employ, for example, an reactive ion etching (RIE) method, an inductively coupled plasma (ICP) etching method, an electron cyclotron resonance (ECR) etching method, a parallel-plate (capacitively coupled plasma) etching method, a magnetron plasma etching method, a dual-frequency plasma etching method, a helicon wave plasma etching method, or the like. The polishing can be performed by chemical mechanical polishing (CMP), liquid jet polishing, or the like.

After the formation of the embrittlement layer 102, the region on and near the surface of the oxide film 101 where the contamination is remarkable is removed by etching, polishing, or the like, whereby the number of impurities which enter the semiconductor film 105 formed over the base substrate 104 can be suppressed. In the semiconductor device which is completed finally, it is possible to prevent the impurities from causing decrease in reliability and decrease in electrical characteristics of transistors, such as variation in threshold voltage and increase in leakage current.

The oxide film 101 forms a bonding plane which is flat and hydrophilic on the surface of the bond substrate 100. Therefore, the average roughness Ra of the oxide film 101 is preferably 0.7 nm or less and more preferably 0.4 nm or less. The thickness of the oxide film 101 can be in the range of 10 nm to 200 nm inclusive. The thickness of the oxide film 101 is preferably in the range of 5 nm to 500 nm inclusive and more preferably in the range of 10 nm to 200 nm inclusive.

Next, as shown in FIG. 1C, plasma is generated under an atmosphere of a gas containing nitrogen atoms and plasma nitridation is performed on the surface of the oxide film 101, so that an insulating film 103 containing nitrogen atoms is formed over the oxide film 101. The composition of the insulating film 103 is determined depending on materials which form the bond substrate 100 and the oxide film 101. Specifically, the insulating film 103 includes a semiconductor such as silicon or germanium in addition to nitrogen atoms as its composition; for example, the insulating film 103 is a silicon nitride film, a silicon oxynitride film, a silicon nitride oxide film, a germanium oxide film, a germanium nitride film, a germanium oxynitride film, or a germanium nitride oxide film.

In this specification, oxynitride refers to a substance which includes more oxygen than nitrogen, and nitride oxide refers to a substance which includes more nitrogen than oxygen. For example, silicon oxynitride is a substance including oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, silicon nitride oxide is a substance which includes oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that the above concentration ranges are obtained when measurements are performed using Rutherford backscattering spectrometry (RBS) or hydrogen forward scattering (HFS). In addition, the total of the percentages of the constituent elements does not exceed 100 atomic %.

In an embodiment of the present invention, with an example where high-density plasma nitridation is performed on the surface of the oxide film 101 to form the insulating film 103 containing nitrogen atoms, a specific manufacturing method thereof will be described. First, a chamber of a microwave excitation high-density plasma apparatus is evacuated using a vacuum pump, and then a mixed gas of a gas containing nitrogen atoms and a rare gas is introduced into the chamber and the pressure in the chamber is set at a predetermined level. High-frequency power of several hundreds W to several thousands W is applied to generate glow discharge with the use of the chamber serving as an anode and a nitridation object serving as a cathode; in such a manner, high-density plasma nitridation is performed. Hydrogen may be added to the above mixed gas.

For example, high-density plasma nitridation is performed on the surface of the oxide film 101 which is silicon oxide for 90 seconds in the following condition: the flow rates of argon and nitrogen are 1000 sccm and 200 sccm, respectively, the pressure in the chamber is 12.00 Pa, the high-frequency power is 1200 W, the frequency is 2.45 GHz, and the substrate temperature is 400° C., whereby the insulating film 103 containing silicon nitride, silicon nitride oxide, or silicon oxynitride with a thickness of approximately 3 nm to 5 nm can be formed.

Note that with the use of high-density plasma nitridation for formation of the insulating film 103, the insulating film 103 containing a higher concentration of nitrogen can be obtained as compared with the case where gas nitridation using thermal process is employed. Metal can be prevented from diffusing into the semiconductor film 105 by using the insulating film 103 formed by the above manufacturing method. Unlike in the case where gas nitridation using thermal process is employed, by plasma nitridation, nitridation reaction can be prevented from proceeding to the vicinity of the interface between the bond substrate and the oxide film and only the surface of the oxide film can be nitrided. The high-density plasma is generated by using a high-frequency microwave, for example, 2.45 GHz. Since high-density plasma having the low electron temperature has a low kinetic energy of active species, the dense insulating film 103 having fewer defects can be formed with fewer plasma damages, compared to a layer formed by conventional plasma treatment.

As a gas containing nitrogen atoms, ammonia, nitrogen, a nitrogen oxide, or the like can be used. A rare gas such as helium, argon, krypton, or xenon, hydrogen, or the like may be used together with the above-described gas containing nitrogen atoms.

Deposition rate at the time of forming the insulating film containing nitrogen by plasma nitridation generally tends to be low in comparison with the case where an evaporation method such as a CVD method is employed. However, when the insulating film containing nitrogen formed by plasma nitridation has a thickness of at least 3 nm or more, the insulating film containing nitrogen has an effect of preventing impurities such as metal from diffusing into the semiconductor film. Such a thickness does not need a long treatment time for plasma nitridation. Specifically, the thickness of the insulating film containing nitrogen is 3 nm to 20 nm, preferably, 3 nm to 5 nm There has been a problem in that dust is generated at the time of deposition with the use of an evaporation method such as a CVD method; however, the insulating film 103 is formed using plasma nitridation, so that a problem of dust which is specific in these evaporation methods can be avoided.

The above impurities can be prevented from diffusing from the base substrate 104 into the semiconductor film 105 of the SOI substrate by using an insulating film containing nitrogen atoms described above for the insulating film 103, even when a substrate containing impurities which decrease the reliability of the semiconductor device, such as an alkali metal or an alkaline earth metal, is used for the base substrate 104.

Note that although these insulating films containing nitrogen atoms have a high effect of preventing impurity diffusion, their internal stress is high. However, in an embodiment of the present invention, the oxide film 101 with an effect of relieving the stress of the insulating film and with a thickness of 50 nm to 1100 nm inclusive is formed between the insulating film and the semiconductor film. Thus, the internal stress of the insulating film can be prevented from affecting the semiconductor film formed over the oxide film 101.

Next, as illustrated in FIG. 1D, the bond substrate 100 and the base substrate 104 are attached to each other so that the insulating film 103 faces the base substrate 104.

Note that before the base substrate 104 and the bond substrate 100 are attached to each other, surface treatment for improving the bonding strength between the insulating film 103 and the base substrate 104 is preferably performed on surfaces for bonding, that is, in this embodiment, surfaces of the insulating film 103 and the base substrate 104 which are formed over the bond substrate 100.

As examples of the surface treatment, wet treatment, dry treatment, and combination of wet treatment and dry treatment can be given. Different kinds of wet treatment or different kinds of dry treatment may be combined to be performed. Examples of the wet treatment include ozone treatment using ozone water (ozone water cleaning), ultrasonic cleaning such as megasonic cleaning, two-fluid cleaning (a method in which functional water such as pure water or hydrogenated water and a carrier gas such as nitrogen are sprayed together), cleaning with hydrochloric acid and a hydrogen peroxide solution, and the like. As examples of the dry treatment, inert gas neutral atomic beam treatment, inert gas ion beam treatment, ultraviolet treatment, ozone treatment, plasma treatment, plasma treatment with bias application, radical treatment, and the like can be given. By performing the above-described surface treatment, the hydrophilicity and cleanliness of the surfaces for attaching can be increased. Thus, the bonding strength can be improved.

For the attaching, the base substrate 104 and the insulating film 103 formed over the bond substrate 100 are disposed in close contact with each other, and then, a pressure of approximately 1 N/cm$^2$ to 500 N/cm$^2$, preferably, 11 N/cm$^2$ to 20 N/cm$^2$ is applied to part of the base substrate 104 and the bond substrate 100 which are superposed on each other. When the pressure is applied, bonding between the base substrate 104 and the insulating film 103 starts from the portion, which results in bonding of the entire surface where the base substrate 104 and the insulating film 103 are in close contact with each other.

The bonding is performed by Van der Waals force or a hydrogen bond, so that the bonding is firm even at room temperature. Note that since the above-described bonding can be performed at a low temperature, a variety of substrates can be used for the base substrate 104. For example, a variety of glass substrates for electronics industry, such as an alumino silicate glass substrate, a barium borosilicate glass substrate, or an aluminoborosilicate glass substrate, a quartz substrate, a ceramic substrate, a sapphire substrate, or the like can be used as the base substrate 104. As the base substrate 104, alternatively, a semiconductor substrate formed of silicon, gallium arsenide, indium phosphide, or the like can be used. Further alternatively, a metal substrate including a stainless steel substrate may be used as the base substrate 104. Substrates with coefficients of thermal expansion ranging from $25\times10^{-7}/°$ C. to $50\times10^{-7}/°$ C. (preferably, $30\times10^{-7}/°$ C. to $40\times10^{-7}/°$ C.) inclusive and strain points ranging from 580° C. to 680° C. (preferably, 600° C. to 680° C.) inclusive are preferably used as the glass substrate which serves as the base substrate 104. When the glass substrate is an alkali-free glass substrate, impurity contamination of semiconductor devices can be suppressed.

As the glass substrate, a mother glass substrate developed for liquid crystal panel production can be used. As the mother glass substrate, for example, a substrate of the 3rd generation (550 mm×650 mm), the 3.5th generation (600 mm×720 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), or the like has been known. By the use of a large-sized mother glass substrate as the base substrate 104 to manufacture an SOI substrate, the SOI substrate can have a larger area. Size increase of an SOI substrate can be realized by using a large-area substrate such as a mother glass substrate, as the base substrate 104. When the SOI substrate can have a larger area, a large number of chips such as ICs or LSIs can be manufactured at one time and the number of chips manufactured from one substrate increases. As a result, the productivity can be improved drastically.

If the base substrate 104 is a glass substrate that largely shrinks when heat treatment is performed thereon, such as EAGLE 2000 (manufactured by Corning Incorporated), a defect may be observed in attachment after the bonding step. Therefore, in order to avoid the defect in attachment that is caused by the shrink, the base substrate 104 may be subjected to heat treatment in advance before the bonding step.

After the bond substrate 100 is attached to the base substrate 104, heat treatment is preferably performed in order to increase the bonding force at the bonding interface between the base substrate 104 and the insulating film 103. This treatment is performed at a temperature where a crack is not generated in the embrittlement layer 102 and can be performed at a temperature in the range of greater than or equal to 200° C. and less than or equal to 400° C. By attaching the bond substrate 100 to the base substrate 104 within this temperature range, the bonding force between the base substrate 104 and the insulating film 103 can be strengthened.

If the bonding plane is contaminated by dust or the like at the time of attaching the bond substrate 100 and the base substrate 104 to each other, the contaminated portion is not bonded. In order to avoid the contamination of the bonding plane, the bond substrate 100 and the base substrate 104 are preferably attached to each other in an airtight chamber. At the time of attaching the bond substrate 100 and the base substrate 104 to each other, the process chamber may have pressure reduced to approximately $5.0 \times 10^{-3}$ Pa and the atmosphere of the bonding process may be cleaned.

In an embodiment of the present invention, the oxide film 101 is formed by thermal oxidation, and the insulating film 103 is formed by plasma nitridation of the oxide film 101. Thus, in comparison with a deposition method using an evaporation method, dust caused by the deposition can be suppressed. It can be prevented that by dust entering a bonding interface, bonding is not performed in a region where the dust exists, so that the semiconductor film is partly chipped after the separation. Therefore, reduction in yield caused by dust in manufacturing an SOI substrate can be prevented.

Next, heat treatment is performed, whereby microvoids which are adjacent to each other in the embrittlement layer 102 are combined and the volume of the microvoids increases. As a result, as illustrated in FIG. 2A, the semiconductor film 105 which is part of the bond substrate 100 is separated from the bond substrate 100 at the embrittlement layer 102. Since the insulating film 103 and the base substrate 104 are bonded to each other, the semiconductor film 105 which is separated from the bond substrate 100 is fixed to the base substrate 104. The heat treatment for separating the semiconductor film 105 from the bond substrate 100 is preferably performed at a temperature which does not exceed the strain point of the base substrate 104.

For this heat treatment, a rapid thermal annealing (RTA) apparatus, a resistance heating furnace, or a microwave heating apparatus can be used. For the RTA apparatus, a gas rapid thermal annealing (GRTA) apparatus or a lamp rapid thermal annealing (LRTA) apparatus can be used. In the case of using a GRTA apparatus, a heating temperature can be set at greater than or equal to 550° C. and less than or equal to 650° C., and processing time can be set at greater than or equal to 0.5 minute and less than or equal to 60 minutes. In the case of using a resistance heating apparatus, the heating temperature can be set at greater than or equal to 200° C. and less than or equal to 650° C., and processing time can be set at greater than or equal to 2 hours and less than or equal to 4 hours.

The heat treatment may be performed by dielectric heating with a high-frequency wave such as a microwave. The heat treatment by dielectric heating can be performed by irradiating the bond substrate 100 with a high-frequency wave with a frequency of 300 MHz to 3 THz generated by a high-frequency wave generation apparatus. Specifically, for example, irradiation with a microwave with a frequency of 2.45 GHz at 900 W is performed for 14 minutes to combine microvoids adjacent to each other in the embrittlement layer, whereby the bond substrate 100 can be split at the embrittlement layer finally.

A specific treatment method of heat treatment using a vertical furnace with resistance heating is described. The base substrate 104 to which the bond substrate 100 is attached is disposed on a boat of the vertical furnace and this boat is delivered in a chamber of the vertical furnace. In order to suppress oxidation of the bond substrate 100, the chamber is evacuated first such that a vacuum state is formed. The degree of vacuum is approximately $5 \times 10^{-3}$ Pa. After a vacuum state is obtained, nitrogen is supplied to the chamber so that the chamber has a nitrogen atmosphere under atmospheric pressure. In this period, the heat temperature is increased to 200° C.

After the chamber is made to have a nitrogen atmosphere under atmospheric pressure, heating is performed at 200° C. for two hours. Then, the temperature is increased to 400° C. in one hour. After the state at a heating temperature of 400° C. is stabilized, the temperature is increased to 600° C. in one hour. After a state in which the heating temperature is 600° C. becomes stable, heat treatment is performed at 600° C. for two hours. Then, the temperature is decreased to 400° C. in one hour, and after 10 minutes to 30 minutes, the boat is carried out of the chamber. The base substrate 104 to which the bond substrate 100 and the semiconductor film 105 are attached and which is disposed on the boat is cooled under an air atmosphere.

The heat treatment using the above resistance heating furnace is performed by successively performing heat treatment for strengthening the bonding force between the insulating film 103 and the base substrate 104 and heat treatment for splitting the embrittlement layer 102. In the case of performing these two kinds of heat treatment in different apparatuses, for example, heat treatment is performed at 200° C. for two hours in a resistance heating furnace and then the base substrate 104 and the bond substrate 100 which are attached to each other are removed from the furnace. Next, heat treatment is performed by an RTA apparatus at a process temperature of greater than or equal to 600° C. and less than or equal to 700° C. for one minute to several hours, so that the bond substrate 100 is split at the embrittlement layer 102.

Note that in some cases, a periphery of the bond substrate 100 is not bonded to the base substrate 104. It is likely that this is because the periphery of the bond substrate 100 is chamfered or has a curvature, so that the base substrate 104 and the insulating film 103 are not in close contact with each other or the embrittlement layer 102 is difficult to split at the periphery of the bond substrate 100. Another reason is that polishing such as CMP performed in manufacturing the bond substrate 100 is insufficient at the periphery of the bond substrate 100, so that a surface thereof is rougher at the periphery than at a center. Still another reason is that, in the case where a carrier or the like damages the periphery of the bond substrate 100 at the time of delivery of the bond substrate 100, the damage makes it difficult to bond the periphery to the base substrate 104. For these reasons, the semiconductor film 105 which is smaller than the bond substrate 100 is attached to the base substrate 104.

Note that the bond substrate 100 may be subjected to hydrogenation treatment before the bond substrate 100 is split. The hydrogenation treatment is performed, for example, at 350° C. for approximately two hours in a hydrogen atmosphere.

If a plurality of bond substrates 100 is attached to the base substrate 104, the plurality of bond substrates 100 may have different crystal plane orientation. The mobility of majority carriers in a semiconductor depends on crystal plane orientation. Therefore, the semiconductor film 105 may be formed by selecting as appropriate the bond substrate 100 which has crystal plane orientation suitable for a semiconductor element to be formed. For example, in the case of forming an n-type semiconductor element with the use of the semiconductor film 105, the formation of the semiconductor film 105 with a {100} plane can increase the mobility of majority carriers in the semiconductor element. On the other hand, for example, in the case of forming a p-type semiconductor element with the use of the semiconductor film 105, the formation of the semiconductor film 105 with a {110} plane can increase the mobility of majority carriers in the semiconductor element. Then, in the case of forming a transistor as a semiconductor element, the bonding direction of the semiconductor film 105 is determined in consideration of a channel direction and crystal plane orientation.

Next, a surface of the semiconductor film 105 may be planarized by polishing. Although not necessarily essential, the planarization makes it possible to improve characteristics of the interface between a gate insulating film and semiconductor films 107 and 108 which are to be formed later. Specifically, the polishing may be chemical mechanical polishing (CMP), liquid jet polishing, or the like. The thickness of the semiconductor film 105 is reduced by the above-described planarization. The planarization may be performed on the semiconductor film 105 before being etched; alternatively, the planarization may be performed on the semiconductor films 107 and 108 formed by etching.

Not the polishing but etching may be performed on the surface of the semiconductor film 105 in order to planarize the surface of the semiconductor film 105. The etching may be performed using a dry etching method such as reactive ion etching (RIE); for example, inductively coupled plasma (ICP) etching, electron cyclotron resonance (ECR) etching, parallel-plate (capacitively coupled type) etching, magnetron plasma etching, dual-frequency plasma etching, helicon wave plasma etching, or the like may be used.

For example, when ICP etching is used, etching may be performed under the following conditions: the flow rate of chlorine, which is an etching gas: 40 sccm to 100 sccm; power applied to a coil-shaped electrode: 100 W to 200 W; the electric power applied to a lower electrode (on the bias side): 40 W to 100 W; and the reaction pressure: 0.5 Pa to 1.0 Pa. In this embodiment, the thickness of the semiconductor film 105 is reduced to about 50 nm to 60 nm by performing the etching under the condition where the flow rate of chlorine as an etching gas is 100 sccm, the reaction pressure is 1.0 Pa, the temperature of the lower electrode is 70° C., the RF (13.56 MHz) electric power applied to the coil-shaped electrode is 150 W, the electric power applied to the lower electrode (on the bias side) is 40 W, and the etching time is about 25 seconds to 27 seconds. For the etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

By the etching, the thickness of the semiconductor layer 105 can be reduced to be optimal for a semiconductor element to be formed later and the surface of the semiconductor film 105 can be planarized, as well.

Figure 2B:
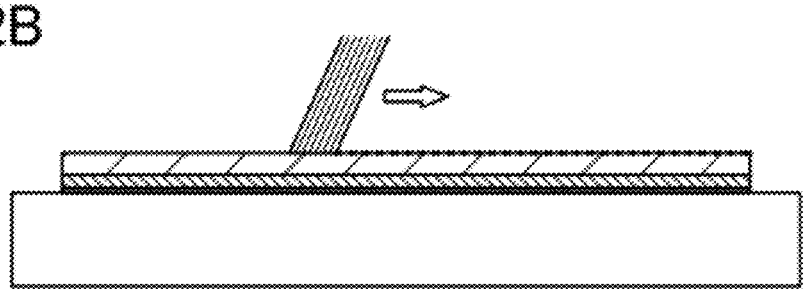

Note that in the semiconductor film 105 disposed in close contact with the base substrate 104, crystal defects due to formation of the embrittlement layer 102 and separation of the embrittlement layer 102 are formed, or the planarity of the surface of the semiconductor film 105 is damaged. In order to reduce the crystal defects and improve the planarity, the semiconductor film 105 is irradiated with laser light as illustrated in FIG. 2B. In the case where the surface of the semiconductor film 105 is planarized by dry etching before the laser light irradiation, damages such as crystal defects might occur on and near the surface of the semiconductor film 105 due to the dry etching. However, the laser light irradiation can repair even the damages caused by the dry etching.

It is preferable that the semiconductor film 105 be partially melted by the laser light irradiation. This is because if the semiconductor film 105 is completely melted, the recrystallization of the semiconductor film 105 is accompanied with disordered nucleation of the semiconductor film 105 in a liquid phase and crystallinity of the semiconductor film 105 is lowered. By partial melting, so-called longitudinal growth in which crystal growth proceeds from an unmelted solid portion occurs in the semiconductor film 105. Due to the recrystallization by the longitudinal growth, crystal defects of the semiconductor film 105 are reduced and crystallinity thereof is recovered. The state in which the semiconductor film 105 is completely melted indicates the state in which the semiconductor film 105 is melted to be in a liquid phase to the interface with the insulating film 103. On the other hand, the state in which the semiconductor film 105 is partially melted indicates that an upper part thereof is melted and is in a liquid phase and a lower part thereof is in a solid phase.

As this laser light irradiation, pulsed laser light irradiation is preferable for partially melting the semiconductor film 105; however, a continuous wave laser or a pseudo continuous wave laser can be used. For example, in the case of a pulsed laser, the repetition rate is less than or equal to 1 MHz and the pulse width is greater than or equal to 10 nanoseconds and less than or equal to 500 nanoseconds. As a laser, for example, a XeCl excimer laser having a repetition rate of 10 Hz to 300 Hz, a pulse width of 25 nanoseconds, and a wavelength of 308 nm can be used.

As the laser light used for the laser light irradiation, a fundamental wave or a second harmonic of a solid-state laser, which is selectively absorbed by a semiconductor, is preferably used. Specifically, for example, laser light having a wavelength in the range of greater than or equal to 250 nm and less than or equal to 700 nm can be used. The energy of the laser light can be determined in consideration of the wavelength of the laser light, the skin depth of the laser light, the thickness of the semiconductor film 105, or the like. For example, in the case where the thickness of the semiconductor film 105 is approximately 120 nm and a pulsed laser that emits laser light having a wavelength of 308 nm is used, the energy density of the laser light may be set to 600 mJ/cm$^2$ to 700 mJ/cm$^2$.

The following pulsed laser can be used: an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser. As a continuous-wave gas laser, an Ar laser, a Kr laser, or the like can be used. In addition, as a continuous-wave solid-state laser, the following can be used: a YAG laser, a $YVO_4$ laser, a YLF laser, a $YAlO_3$ laser, a forsterite ($Mg_2SiO_4$) laser, a $GdVO_4$ laser, a $Y_2O_3$ laser, a glass laser, a ruby laser, an alexandrite laser, a Ti:sapphire laser, or the like.

The laser light irradiation is preferably performed in an inert atmosphere such as a rare gas atmosphere or a nitrogen atmosphere, or in a vacuum state. In the case of an inert atmosphere, the laser light irradiation may be performed in an airtight chamber whose atmosphere is controlled. If the chamber is not used, the laser light irradiation in an inert atmosphere can be achieved by spraying an inert gas such as a nitrogen gas to the surface to be irradiated with the laser light. The inert atmosphere such as a nitrogen atmosphere or the vacuum state makes the available laser energy range wider as compared with the air atmosphere because the inert atmosphere and the vacuum state have a higher effect of improving the planarity of the semiconductor film 105 and a higher effect of suppressing cracks and ridges than the air atmosphere.

The laser light preferably has its cross section shaped into a linear form with homogenous energy distribution through an optical system. Accordingly, the laser light irradiation can be performed homogenously at high throughput. With the beam length of the laser light longer than one side of the base substrate 104, the entire semiconductor film 105 attached to the base substrate 104 can be irradiated with the laser light by scanning once. When the beam length of the laser light is shorter than one side of the base substrate 104, the beam length may be set so that the entire semiconductor film 105 attached to the base substrate 104 can be irradiated with the laser light by scanning a plurality of times.

Before irradiating the semiconductor film 105 with the laser light, an oxide film such as a natural oxide film formed on the surface of the semiconductor film 105 is desirably removed. The oxide film is removed because the surface of the semiconductor film 105 is not planarized sufficiently even if the laser light irradiation is performed on the semiconductor film 105 with the oxide film remaining on the surface. The oxide film can be removed by performing treatment on the semiconductor film 105 with hydrofluoric acid. The treatment with hydrofluoric acid is desirably performed until the surface of the semiconductor film 105 has water repellency. Having water repellency indicates the removal of the oxide film from the semiconductor film 105.

For example, the laser light irradiation step can be specifically performed as follows. First, the semiconductor film 105 is processed for 110 seconds with dilute hydrogen fluoride (DHF) which is an aqueous solution having a 0.5 wt % hydrogen fluoride to remove the oxide film on the surface of the semiconductor film 105. As a laser, a XeCl excimer laser (wavelength: 308 nm, pulse width: 20 ns, and repetition rate: 30 Hz) is used. The cross section of the laser light is shaped into a linear form with a size of 0.35 mm×120 mm through an optical system. The laser scanning speed is 0.5 mm/s and the scanning pitch is 16 µm, and the beam shot number is about 20; in this manner, the semiconductor film 105 is irradiated with the laser light.

The semiconductor film 105 is irradiated with the laser light, whereby the surface of the semiconductor film 105 which has unevenness due to the separation can be planarized or the crystallinity of the semiconductor film 105 in which crystal defects are formed due to the separation can be increased. In an embodiment of the present invention, since the insulating film 103 containing nitrogen atoms is formed between the base substrate 104 and the semiconductor film 105, metal such as copper or iron which is contained in the base substrate 104 can be prevented from diffusing into the semiconductor film 105 by the laser light irradiation.

After the laser light irradiation, the surface of the semiconductor film 105 may be etched. If the surface of the semiconductor film 105 is etched after the laser light irradiation, the surface of the semiconductor film 105 is not necessarily etched before the laser light irradiation. Moreover, if the surface of the semiconductor film 105 is etched before the laser light irradiation, the surface of the semiconductor film 105 is not necessarily etched after the laser light irradiation. In the present invention, alternatively, the etching may be performed both before and after the laser light irradiation.

The etching can not only thin the semiconductor film 105 to the film thickness optimum for a semiconductor element to be formed later but also planarize the surface of the semiconductor film 105.

After the laser light irradiation, the semiconductor film 105 is preferably subjected to heat treatment at 500° C. to 650° C. inclusive. This heat treatment can eliminate the defects of the semiconductor film 105 and relieve the distortion of the semiconductor film 105, which are not repaired by the laser light irradiation. This heat treatment can employ an RTA (rapid thermal anneal) apparatus, a resistance heating furnace, or a microwave heating apparatus. As the RTA apparatus, a GRTA (gas rapid thermal anneal) apparatus or an LRTA (lamp rapid thermal anneal) can be used. For example, in the case of using a resistance heating furnace, heat treatment may be performed at 500° C. for an hour and then another heat treatment may be performed at 550° C. for four hours.

Figure 2C:
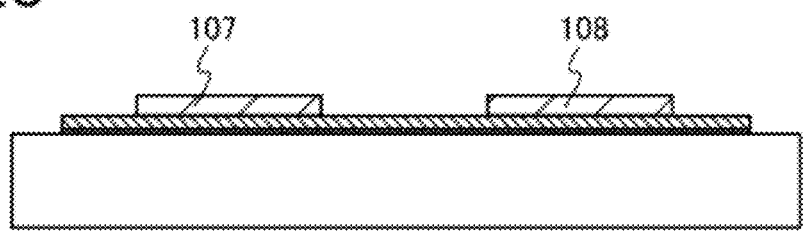

Next, as shown in FIG. 2C, the semiconductor film 105 is partly etched into the semiconductor film 107 and the semiconductor film 108. By further etching the semiconductor film 105, a region of the semiconductor film 105 at the end thereof where the bonding strength is not sufficient can be removed.

Although the semiconductor films 107 and 108 are formed by etching one semiconductor film 105 in this embodiment, the number of semiconductor films which are formed is not limited to two.

In an embodiment of the present invention, the oxide film 101 is formed between the insulating film 103 and the semiconductor film 105. The insulating film 103 has an effect of preventing impurities in the base substrate 104 from diffusing into the semiconductor film 105, and has a small thickness of 3 nm to 20 nm, preferably, 3 nm to 5 nm. Therefore, when a structure in which only the insulating film 103 is interposed between the semiconductor film 105 and the base substrate 104 is employed, in etching the semiconductor film 105, the insulating film 103 is partly lost by overetching and the base substrate 104 is easily exposed. However, in an embodiment of the present invention, since the oxide film 101 with a thickness of 50 nm to 1100 nm (preferably, 100 nm to 300 nm) is formed between the semiconductor film 105 and the insulating film 103, the base substrate 104 is hardly exposed in etching the semiconductor film 105, even when a region other than a region of the oxide film 101 which is covered with the semiconductor film 107 and the semiconductor film 108 is slightly overetched. Thus, by exposing the base substrate 104, the impurities in the base substrate 104 can be prevented from entering the semiconductor film 107 and the semiconductor film 108.

Figure 2D:
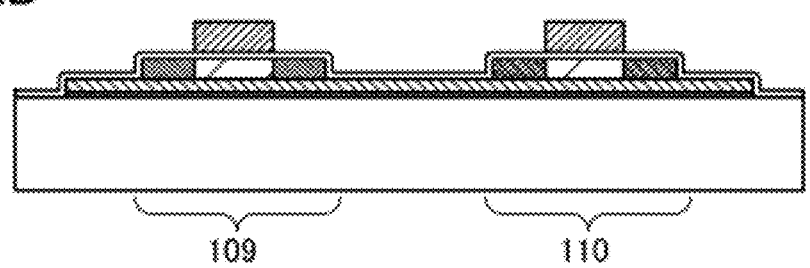

With the use of the semiconductor films 107 and 108 formed through the above steps, for example, a variety of semiconductor elements such as a transistor 109 and a transistor 110 shown in FIG. 2D can be formed.

Note that a semiconductor film 105 can be separated again from the bond substrate 100 by planarizing the surface of the bond substrate 100 from which the semiconductor film 105 is separated.

Specifically, the oxide film 101 and the insulating film 103 which remain mainly at ends of the bond substrate 100 are removed by etching or the like. In the case where the oxide film 101 and the insulating film 103 are formed using silicon oxide, silicon oxynitride, silicon nitride oxide, or the like, wet etching using hydrofluoric acid can be employed.

Next, projections formed at the ends of the bond substrate 100 due to the separation of the semiconductor film 105 and the remaining embrittlement layer which contains hydrogen excessively are removed. For the etching of the bond substrate 100, wet etching is preferably used, and a tetramethylammonium hydroxide (abbr. TMAH) solution can be used as an etchant.

Then, the surface of the bond substrate 100 is polished. For the polishing, CMP can be used. To smooth the surface of the bond substrate 100, the surface is desirably polished by approximately 1 µm to 10 µm in thickness. After the polishing, hydrofluoric acid cleaning or RCA cleaning is performed because abrasive particles and the like are left on the surface of the bond substrate 100.

By reusing the bond substrate 100, the cost of a material of the semiconductor substrate can be reduced.

Embodiment 2

In this embodiment, methods for manufacturing an SOI substrate and a semiconductor device in which the insulating film 103 is formed before the formation of the embrittlement layer 102 will be described.

Figure 3A:
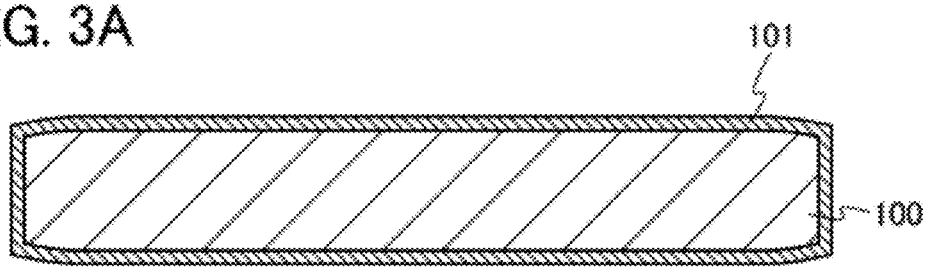
FIGS. 3A to 3D are diagrams illustrating a manufacturing method according to an embodiment of the present invention.

First, similarly to Embodiment 1, the bond substrate 100 is cleaned, and then the oxide film 101 is formed over the bond substrate 100, as shown in FIG. 3A.

Figure 3B:
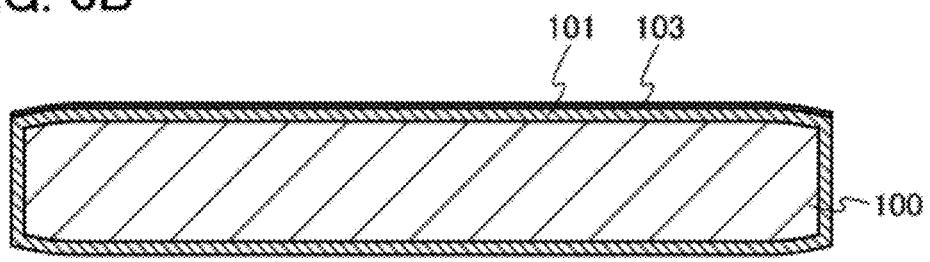

Next, as shown in FIG. 3B, plasma is generated under an atmosphere of a gas containing nitrogen atoms and plasma nitridation is performed on the surface of the oxide film 101, so that the insulating film 103 containing nitrogen atoms is formed over the oxide film 101. The composition of the insulating film 103 is determined depending on materials which form the bond substrate 100 and the oxide film 101. Specifically, the insulating film 103 includes a semiconductor such as silicon or germanium in addition to nitrogen atoms as its composition; for example, the insulating film 103 is a silicon nitride film, a silicon oxynitride film, a silicon nitride oxide film, a germanium oxide film, a germanium nitride film, a germanium oxynitride film, or a germanium nitride oxide film.

In an embodiment of the present invention, with an example where high-density plasma nitridation is performed on the surface of the oxide film 101 to form the insulating film 103 containing nitrogen atoms, a specific manufacturing method thereof will be described. First, a chamber of a microwave excitation high-density plasma apparatus is evacuated using a vacuum pump, and then a mixed gas of a gas containing nitrogen atoms and a rare gas is introduced into the chamber and the pressure in the chamber is set at a predetermined level. High-frequency power of several hundreds W to several thousands W is applied to generate glow discharge with the use of the chamber serving as an anode and a nitridation object serving as a cathode; in such a manner, high-density plasma nitridation is performed. Hydrogen may be added to the above mixed gas.

For example, high-density plasma nitridation is performed on the surface of the oxide film 101 which is silicon oxide for 90 seconds in the following condition: the flow rates of argon and nitrogen are 1000 sccm and 200 sccm, respectively, the pressure in the chamber is 12.00 Pa, the high-frequency power is 1200 W, the frequency is 2.45 GHz, and the substrate temperature is 400° C., whereby the insulating film 103 containing silicon nitride, silicon nitride oxide, or silicon oxynitride with a thickness of approximately 3 nm to 5 nm can be formed.

Note that with the use of high-density plasma nitridation for formation of the insulating film 103, the insulating film 103 containing a higher concentration of nitrogen can be obtained as compared with the case where gas nitridation using thermal process is employed. Metal can be prevented from diffusing into the semiconductor film 105 by using the insulating film 103 formed by the above manufacturing method. Unlike in the case where gas nitridation using thermal process is employed, by plasma nitridation, nitridation reaction can be prevented from proceeding to the vicinity of the interface between the bond substrate and the oxide film and only the surface of the oxide film can be nitrided. The high-density plasma is generated by using a high-frequency microwave, for example, 2.45 GHz. Since high-density plasma having the low electron temperature has a low kinetic energy of active species, the dense insulating film 103 having fewer defects can be formed with fewer plasma damages, compared to a layer formed by conventional plasma treatment.

As a gas containing nitrogen atoms, ammonia, nitrogen, a nitrogen oxide, or the like can be used. A rare gas such as helium, argon, krypton, or xenon, hydrogen, or the like may be used together with the above-described gas containing nitrogen atoms.

Deposition rate at the time of forming the insulating film containing nitrogen by plasma nitridation generally tends to be low in comparison with the case where an evaporation method such as a CVD method is employed. However, when the insulating film containing nitrogen formed by plasma nitridation has a thickness of at least 3 nm or more, the insulating film containing nitrogen has an effect of preventing impurities such as metal from diffusing into the semiconductor film. Such a thickness does not need a long treatment time for plasma nitridation. Specifically, the thickness of the insulating film containing nitrogen is 3 nm to 20 nm, preferably, 3 nm to 5 nm. There has been a problem in that dust is generated at the time of deposition with the use of an evaporation method such as a CVD method; however, the insulating film 103 is formed using plasma nitridation, so that a problem of dust which is specific in these evaporation methods can be avoid.

The above impurities can be prevented from diffusing from the base substrate 104 into the semiconductor film 105 of the SOI substrate by using an insulating film containing nitrogen atoms described above for the insulating film 103, even when a substrate containing impurities which decrease the reliability of the semiconductor device, such as an alkali metal or an alkaline earth metal, is used for the base substrate 104.

Note that although these insulating films containing nitrogen atoms have a high effect of preventing impurity diffusion, their internal stress is high. However, in an embodiment of the present invention, the oxide film 101 with an effect of relieving the stress of the insulating film and with a thickness of 50 nm to 1100 nm inclusive is formed between the insulating film and the semiconductor film. Thus, the internal stress of the insulating film can be prevented from affecting the semiconductor film formed over the oxide film 101.

Figure 3C:
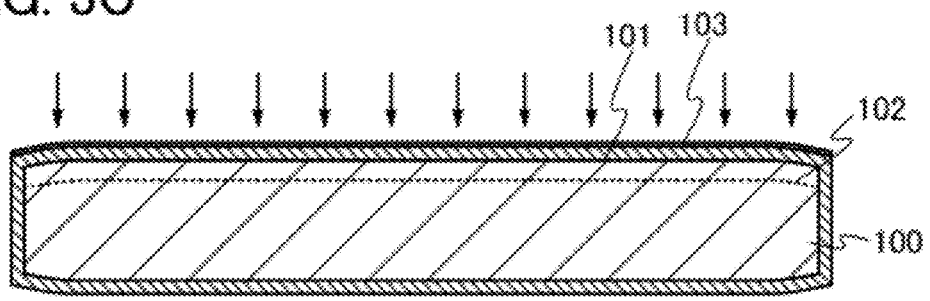

Next, similarly to Embodiment 1, as shown in FIG. 3C, the bond substrate 100 is irradiated with an ion beam including ions accelerated by an electric field through the oxide film 101 and the insulating film 103 as indicated by arrows, whereby the embrittlement layer 102 having microvoids is formed in a region at a predetermined depth from a surface of the bond substrate 100.

The depth at which the embrittlement layer 102 is formed can be adjusted by the acceleration energy of the ion beam and the incident angle thereof. The acceleration energy can be adjusted by acceleration voltage or the like. The embrittlement layer 102 is formed at the same depth or substantially the same depth as the average penetration depth of the ions. The thickness of the semiconductor film 105 which will be separated from the bond substrate 100 is determined based on the depth at which the ions are implanted. The depth at which the embrittlement layer 102 is formed can be set in the range of, for example, 50 nm to 500 nm inclusive, preferably 50 nm to 200 nm inclusive, from the surface of the bond substrate 100.

The ions are implanted to the bond substrate 100 desirably by an ion doping method in which mass separation is not performed, because the cycle time is short; however, the present invention may employ an ion implantation method in which mass separation is performed.

When hydrogen ($H_2$) is used for a source gas, $H^+$, $H_2^+$, and $H_3^+$ can be produced by exciting a hydrogen gas. Proportions of ion species produced from a source gas can be changed by controlling a plasma excitation method, the pressure of an atmosphere for producing plasma, the amount of supplied source gas, or the like. In the case where the ion implantation is performed by an ion doping method, $H_3^+$ is preferably contained at 50% or more, more preferably contained at 80% or more with respect to the total amount of $H^+$, $H_2^+$, and $H_3^+$ in the ion beam. When $H_3^+$ is contained at 80% or more, the proportion of $H_2^+$ ions contained in the ion beam gets smaller relatively, which results in lower variation in the average penetration depth of the hydrogen ions contained in the ion beam. Consequently, the ion implantation efficiency improves and the cycle time can be shortened.

Further, $H_3^+$ has larger mass than $H^+$ and $H_2^+$. When the ion beam containing a higher proportion of $H_3^+$ is compared with the ion beam containing a higher proportion of $H^+$ and $H_2^+$, the former can implant hydrogen into a shallower region of the bond substrate 100 than the latter even if the acceleration voltage at the time of doping is the same. Moreover, the former has a steep concentration distribution of hydrogen implanted into the bond substrate 100 in a thickness direction, the embrittlement layer 102 itself can be formed to be thinner.

In the case of performing ion implantation by an ion doping method with the use of a hydrogen gas, the acceleration voltage is set in the range of 10 kV to 200 kV inclusive and the dosage is set in the range of $1 \times 10^{16}$ ions/cm$^2$ to $6 \times 10^{16}$ ions/cm$^2$ inclusive. Under this condition, the embrittlement layer 102 can be formed in a region at a depth of 50 nm to 500 nm inclusive from the surface of the bond substrate 100, though depending on the ion species contained in the ion beam and its proportion, and the film thicknesses of the oxide film 101 and the insulating film 103.

For example, in the case where the bond substrate 100 is a single crystal silicon substrate and the total thickness of the oxide film 101 and the insulating film 103 is 100 nm, a semiconductor film with a thickness of approximately 140 nm can be separated from the bond substrate 100 under the condition where the flow rate of 100% hydrogen gas, which is the source gas, is 50 sccm, the beam current density is 5 $\mu$A/cm$^2$, the acceleration voltage is 50 kV, and the dosage is $2.0 \times 10^{16}$ ions/cm$^2$. Note that even if the condition at the time of adding hydrogen to the bond substrate 100 is not changed, the thicknesses of the oxide film 101 and the insulating film 103 are made larger, whereby the thickness of the semiconductor film can be made smaller.

Helium (He) can alternatively be used as the source gas of the ion beam. Since most of the ion species produced by exciting helium are He$^+$, He can be mainly implanted into the bond substrate 100 even by an ion doping method in which mass separation is not performed. Therefore, microvoids can be formed in the embrittlement layer 102 efficiently by an ion doping method. In the case of performing the ion implantation by an ion doping method using helium, the acceleration voltage can be set in the range of 10 kV to 200 kV inclusive and the dosage can be set in the range of $1 \times 10^{16}$ ions/cm$^2$ to $6 \times 10^{16}$ ions/cm$^2$ inclusive.

A halogen gas such as a chlorine gas (Cl$_2$ gas) or a fluorine gas (F$_2$ gas) can be used for the source gas.

Figure 3D:
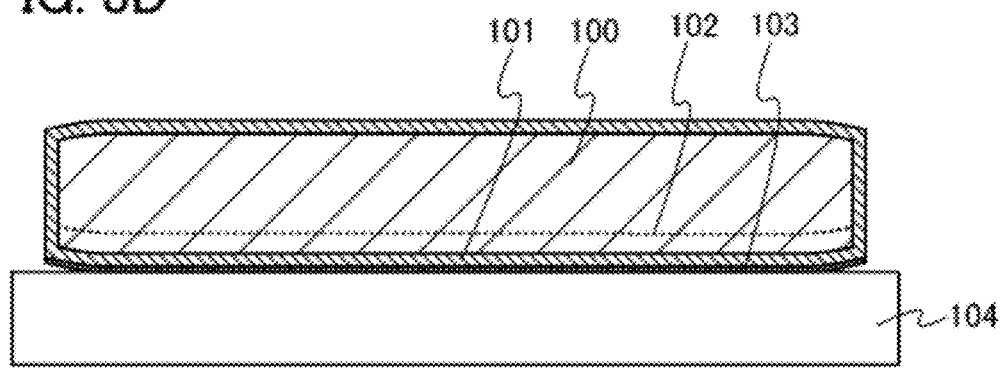

Next, as illustrated in FIG. 3D, the bond substrate 100 and the base substrate 104 are attached to each other so that the insulating film 103 faces the base substrate 104.

Note that before the base substrate 104 and the bond substrate 100 are attached to each other, surface treatment for improving the bonding strength between the insulating film 103 and the base substrate 104 is preferably performed on surfaces for bonding, that is, in this embodiment, surfaces of the insulating film 103 and the base substrate 104 which are formed over the bond substrate 100.

As examples of the surface treatment, wet treatment, dry treatment, and combination of wet treatment and dry treatment can be given. Different kinds of wet treatment or different kinds of dry treatment may be combined to be performed. Examples of the wet treatment include ozone treatment using ozone water (ozone water cleaning), ultrasonic cleaning such as megasonic cleaning, two-fluid cleaning (a method in which functional water such as pure water or hydrogenated water and a carrier gas such as nitrogen are sprayed together), cleaning with hydrochloric acid and a hydrogen peroxide solution, and the like. As examples of the dry treatment, inert gas neutral atomic beam treatment, inert gas ion beam treatment, ultraviolet treatment, ozone treatment, plasma treatment, plasma treatment with bias application, radical treatment, and the like can be given. By performing the above-described surface treatment, the hydrophilicity and cleanliness of the surfaces for attaching can be increased. Thus, the bonding strength can be improved.

For the attaching, the base substrate 104 and the insulating film 103 formed over the bond substrate 100 are disposed in close contact with each other, and then, a pressure of approximately 1 N/cm$^2$ to 500 N/cm$^2$, preferably, 11 N/cm$^2$ to 20 N/cm$^2$ is applied to part of the base substrate 104 and the bond substrate 100 which are superposed on each other. When the pressure is applied, bonding between the base substrate 104 and the insulating film 103 starts from the portion, which results in bonding of the entire surface where the base substrate 104 and the insulating film 103 are in close contact with each other.

The bonding is performed by Van der Waals force or a hydrogen bond, so that the bonding is firm even at room temperature. Note that since the above-described bonding can be performed at a low temperature, a variety of substrates can be used for the base substrate 104. For example, a variety of glass substrates for electronics industry, such as an alumino silicate glass substrate, a barium borosilicate glass substrate, or an aluminoborosilicate glass substrate, a quartz substrate, a ceramic substrate, a sapphire substrate, or the like can be used as the base substrate 104. As the base substrate 104, alternatively, a semiconductor substrate formed of silicon, gallium arsenide, indium phosphide, or the like can be used. Further alternatively, a metal substrate including a stainless steel substrate may be used as the base substrate 104. Substrates with coefficients of thermal expansion ranging from $25 \times 10^{-7}/°$C. to $50 \times 10^{-7}/°$C. (preferably, $30 \times 10^{-7}/°$C. to $40 \times 10^{-7}/°$C.) inclusive and strain points ranging from 580° C. to 680° C. (preferably, 600° C. to 680° C.) inclusive are preferably used as the glass substrate which serves as the base substrate 104. When the glass substrate is an alkali-free glass substrate, impurity contamination of semiconductor devices can be suppressed.

As the glass substrate, a mother glass substrate developed for production of liquid crystal panels can be used. As the mother glass substrate, for example, a substrate of the 3rd generation (550 mm×650 mm), the 3.5th generation (600 mm×720 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), or the like has been known. When an SOI substrate is manufactured using a large-sized mother glass for the base substrate 104, the SOI substrate can have a large area. By the use of a large-area substrate like a mother glass substrate as the base substrate 104, an SOI substrate can have a larger area. When the SOI substrate can have a larger area, a large number of chips such as ICs or LSIs can be manufactured at one time and the number of chips manufactured from one substrate increases. As a result, the productivity can be improved drastically.

If the base substrate 104 is a glass substrate that largely shrinks when heat treatment is performed thereon, such as EAGLE 2000 (manufactured by Corning Incorporated), a defect may be observed in attachment after the bonding step.

Therefore, in order to avoid the defect in attachment that is caused by the shrink, the base substrate 104 may be subjected to heat treatment in advance before the bonding step.

Moreover, an insulating film may be formed in advance over the base substrate 104. The base substrate 104 is not necessarily provided with an insulating film on its surface. However, the formation of the insulating film on the surface of the base substrate 104 can prevent impurities of the base substrate 104, such as an alkali metal and an alkaline earth metal, from entering the bond substrate 100. Moreover, in the case of forming the insulating film on the surface of the base substrate 104, the insulating film over the base substrate 104 is bonded to the insulating film 103; therefore, a wider variety of substrates can be used as the base substrate 104. In general, the upper temperature limits of substrates formed of flexible synthetic resins such as plastics tend to be low. However, as long as the substrates can resist process temperatures in later steps of manufacturing semiconductor elements, the substrates formed of such resins can be used as the base substrate 104 in the case of forming the insulating film over the base substrate 104. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like. In the case of forming the insulating film over the base substrate 104, the attachment is preferably performed after a surface of the insulating film is subjected to surface treatment in a manner similar to that of the insulating film 103.

After the bond substrate 100 is attached to the base substrate 104, heat treatment is preferably performed in order to increase the bonding force at the bonding interface between the base substrate 104 and the insulating film 103. This heat treatment is performed at a temperature at which the embrittlement layer 102 does not crack; specifically, the temperature is in the range of 200° C. to 400° C. inclusive. By attaching the bond substrate 100 to the base substrate 104 within this temperature range, the bonding force between the base substrate 104 and the insulating film 103 can be made firm.

If the bonding plane is contaminated by dust or the like at the time of attaching the bond substrate 100 and the base substrate 104 to each other, the contaminated portion is not bonded. In order to avoid the contamination of the bonding plane, the attachment of the bond substrate 100 and the base substrate 104 to each other is preferably performed in an airtight chamber. At the time of attaching the bond substrate 100 and the base substrate 104 to each other, the process chamber may have pressure reduced to approximately $5.0 \times 10^{-3}$ Pa and the atmosphere of the bonding process may be cleaned.

In an embodiment of the present invention, the oxide film 101 is formed by thermal oxidation, and the insulating film 103 is formed by plasma nitridation of the oxide film 101. Thus, in comparison with a deposition method using an evaporation method, dust caused by the deposition can be suppressed. It can be prevented that by dust entering a bonding interface, bonding is not performed in a region where the dust exists, so that the semiconductor film is partly chipped after the separation. Therefore, reduction in yield caused by dust in manufacturing an SOI substrate can be prevented.

Subsequently, heat treatment is performed whereby microvoids adjacent to each other in the embrittlement layer 102 are combined, so that the microvoids increase in volume. As a result, as shown in FIG. 2A in Embodiment 1, the semiconductor film 105 which is part of the bond substrate 100 is separated from the bond substrate 100 at the embrittlement layer 102. Embodiment 1 can be referred to for description of the following manufacturing process.

In an embodiment of the present invention, since the insulating film 103 containing nitrogen atoms is formed between the base substrate 104 and the semiconductor film 105, metal such as copper or iron which is contained in the base substrate 104 can be prevented from diffusing into the semiconductor film 105 by the laser light irradiation.

In an embodiment of the present invention, the oxide film 101 is formed between the insulating film 103 and the semiconductor film 105. The insulating film 103 has an effect of preventing impurities in the base substrate 104 from diffusing into the semiconductor film 105, and has a small thickness of 3 nm to 20 nm, preferably, 3 nm to 5 nm. Therefore, when a structure in which only the insulating film 103 is interposed between the semiconductor film 105 and the base substrate 104 is employed, in etching the semiconductor film 105, the insulating film 103 is partly lost by overetching and the base substrate 104 is easily exposed. However, in an embodiment of the present invention, since the oxide film 101 with a thickness of 50 nm to 1100 nm (preferably, 100 nm to 300 nm) is formed between the semiconductor film 105 and the insulating film 103, the base substrate 104 is hardly exposed in etching the semiconductor film 105, even when a region other than a region of the oxide film 101 which is covered with the semiconductor film 107 and the semiconductor film 108 is slightly overetched. Thus, by exposing the base substrate 104, the impurities in the base substrate 104 can be prevented from entering the semiconductor film 107 and the semiconductor film 108.

This embodiment can be implemented in combination with the above embodiment as appropriate.

Embodiment 3

In this embodiment, a method for manufacturing a thin film transistor, one of semiconductor elements, will be described as an example of a method for manufacturing a semiconductor device using a base substrate to which a semiconductor film is attached, a so-called SOI substrate. By combining a plurality of thin film transistors, a variety of semiconductor devices can be formed.

Figure 4A:
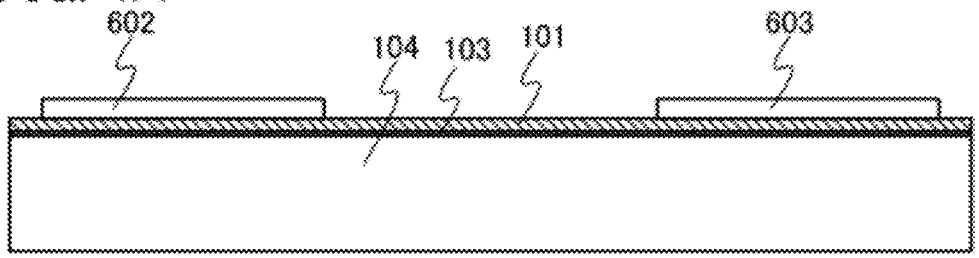
FIGS. 4A to 4D are diagrams illustrating a manufacturing method according to an embodiment of the present invention.

First, as shown in FIG. 4A, an island-shape semiconductor film 602 and an island-shape semiconductor film 603 are formed over the base substrate 104 with the insulating film 103 and the oxide film 101 interposed therebetween.

In order to control threshold voltage, a p-type impurity such as boron, aluminum, or gallium or an n-type impurity such as phosphorus or arsenic may be added to the semiconductor films 602 and 603. For example, in the case of adding boron as an impurity imparting p-type conductivity, boron may be added at a concentration of $5 \times 10^{16}$ cm$^{-3}$ to $1 \times 10^{17}$ cm$^{-3}$ inclusive. The addition of an impurity for controlling threshold voltage may be performed on the semiconductor film before being patterned or on the semiconductor films 602 and 603 formed after the patterning. Alternatively, the addition of an impurity for controlling threshold voltage may be performed on the bond substrate. Further alternatively, the addition of an impurity may be performed first on the bond substrate in order to roughly control the threshold voltage and then on the semiconductor film before being patterned or on the semiconductor films 602 and 603 which are formed after the patterning in order to finely control the threshold voltage.

Moreover, hydrogenation treatment may be performed after forming the semiconductor films 602 and 603 and before forming gate insulating films 604. Hydrogenation treatment is performed, for example, at 350° C. for about 2 hours in a hydrogen atmosphere.

Figure 4B:
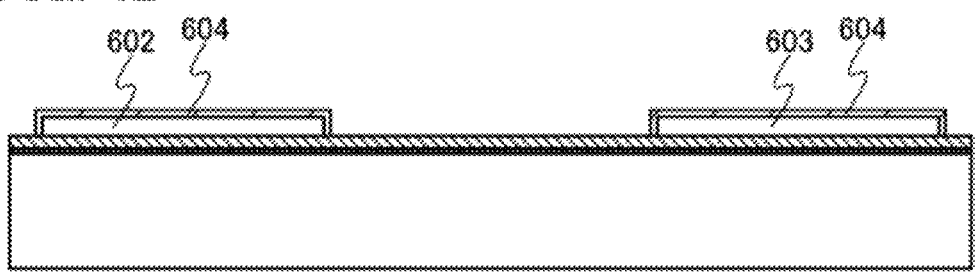

Next, as shown in FIG. 4B, the gate insulating films 604 are formed so as to cover the semiconductor films 602 and 603. Surfaces of the semiconductor films 602 and 603 may be oxidized or nitrided by high-density plasma treatment, so that the gate insulating films 604 can be formed. The high-density plasma treatment is performed using a mixed gas of a rare gas such as He, Ar, Kr, or Xe and any of oxygen, nitrogen oxide, ammonia, nitrogen, hydrogen, or the like. When plasma excitation is performed by introduction of microwaves, plasma with a low electron temperature and high density can be generated. The surfaces of the semiconductor films are oxidized or nitrided by oxygen radicals (which include OH radicals in some cases) or nitrogen radicals (which include NH radicals in some cases) produced by such high-density plasma, whereby insulating films each having a thickness of 1 nm to 20 nm, desirably 5 nm to 10 nm, are formed in contact with the semiconductor films. The insulating films each having a thickness of 5 nm to 10 nm are used as the gate insulating films 604. For example, nitrous oxide ($N_2O$) is diluted with Ar by 1 to 3 times (flow ratio) and a microwave (2.45 GHz) electric power of 3 kW to 5 kW is applied with a pressure of 10 Pa to 30 Pa to oxidize or nitride the surfaces of the semiconductor films 602 and 603. By this process, insulating films each having a thickness of 1 nm to 10 nm (preferably, 2 nm to 6 nm) are formed. Moreover, nitrous oxide ($N_2O$) and silane ($SiH_4$) are introduced and a microwave (2.45 GHz) electric power of 3 kW to 5 kW is applied with a pressure of 10 Pa to 30 Pa to form a silicon oxynitride film by a vapor deposition method, thereby forming a gate insulating film. With a combination of a solid-phase reaction and a reaction by a vapor deposition method, the gate insulating film with low interface state density and excellent withstand voltage can be formed.

Since the oxidation or nitridation of the semiconductor films by the high-density plasma treatment is a solid-phase reaction, the interface state density between the gate insulating film 604 and each of the semiconductor films 602 and 603 can be extremely decreased. Further, since the semiconductor films 602 and 603 are directly oxidized or nitrided by the high-density plasma treatment, variation in thickness of the insulating film to be formed can be suppressed. Moreover, in the case where the semiconductor films have crystallinity, the surfaces of the semiconductor films are oxidized by the solid state reaction through the high-density plasma treatment, whereby rapid oxidation only at crystal grain boundaries can be suppressed and the gate insulating film with favorable uniformity and low interface state density can be formed. A transistor in which the insulating film formed by the high-density plasma treatment is used as part of the gate insulating film or as the whole gate insulating film can have less variation in characteristics.

Alternatively, the gate insulating films 604 may be formed by thermally oxidizing the semiconductor films 602 and 603. The gate insulating films 604 may be formed of a single layer or stacked layers of a film including silicon oxide, silicon nitride oxide, silicon oxynitride, silicon nitride, hafnium oxide, aluminum oxide, or tantalum oxide, by a plasma CVD method, a sputtering method, or the like.

Alternatively, heat treatment may be performed at a temperature in the range of 350° C. to 450° C. inclusive after the formation of the gate insulating films 604 containing hydrogen, whereby hydrogen in the gate insulating films 604 diffuses into the semiconductor films 602 and 603. In this case, the gate insulating films 604 may be formed by depositing silicon nitride or silicon nitride oxide by a plasma CVD method at a process temperature of 350° C. or lower. By supplying hydrogen to the semiconductor films 602 and 603, defects which serve as trapping centers in the semiconductor films 602 and 603 and at an interface between the gate insulating film 604 and each of the semiconductor films 602 and 603 can be decreased.

Figure 4C:
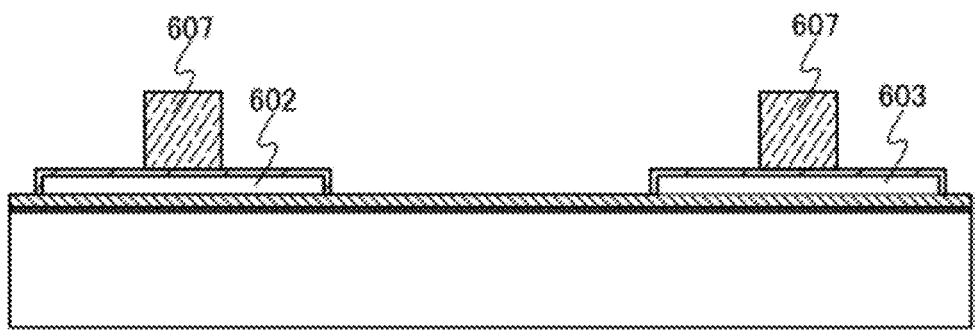

Next, a conductive film is formed over the gate insulating films 604, and then the conductive film is processed (patterned) into predetermined shapes, whereby electrodes 607 are formed over the semiconductor films 602 and 603 as illustrated in FIG. 4C. A CVD method, a sputtering method, or the like can be used for forming the conductive film. For the conductive film, tantalum (Ta), tungsten (W), titanium (Ti), molybdenum (Mo), aluminum (Al), copper (Cu), chromium (Cr), niobium (Nb), or the like can be used. Alternatively, an alloy containing the above-described metal as a main component or a compound containing the above-described metal can also be used. Alternatively, the conductive film may be formed of a semiconductor such as polycrystalline silicon obtained by doping a semiconductor film with an impurity element such as phosphorus which imparts conductivity.

In a case of employing a two-layer structure, tantalum nitride or tantalum (Ta) can be used for a first layer and tungsten (W) can be used for a second layer. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two layers of the conductive film are formed. In addition, as a combination of the two conductive films, for example, nickel silicide and silicon doped with an impurity which imparts n-type conductivity, $WSi_x$ and silicon doped with an impurity which imparts n-type conductivity, or the like can be used.

Although the electrode 607 is formed by a single-layer conductive film in this embodiment, this embodiment is not limited to this structure. The electrode 607 may be formed by stacking plural conductive films. In the case of a three-layer structure in which more than three conductive films are stacked, a stacked-layer structure of a molybdenum film, an aluminum film, and a molybdenum film is preferably employed.

As a mask used for forming the electrodes 607, silicon oxide, silicon nitride oxide, or the like may be used instead of resist. Although, in this case, a step of forming the mask made of silicon oxide, silicon nitride oxide, or the like by patterning is added, the decrease in film thickness and width of the mask at the time of etching is less than that in the case of using a resist mask; accordingly, the electrodes 607 each having a desired width can be formed. Alternatively, the electrodes 607 may be formed selectively by a droplet discharge method without using the mask.

Note that a droplet discharge method means a method in which droplets containing a predetermined composition are discharged or ejected from fine pores to form a predetermined pattern, and includes an inkjet method and the like.

The electrodes 607 can be formed in such a manner that the conductive film is etched into desired tapered shapes by an ICP (inductively coupled plasma) etching method in which the etching condition (e.g., the amount of electric power applied to a coil-shaped electrode layer, the amount of electric power applied to an electrode layer on the substrate side, and the electrode temperature on the substrate side) is controlled as appropriate. Further, angles and the like of the tapered shapes can also be controlled by the shape of the mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 4D:
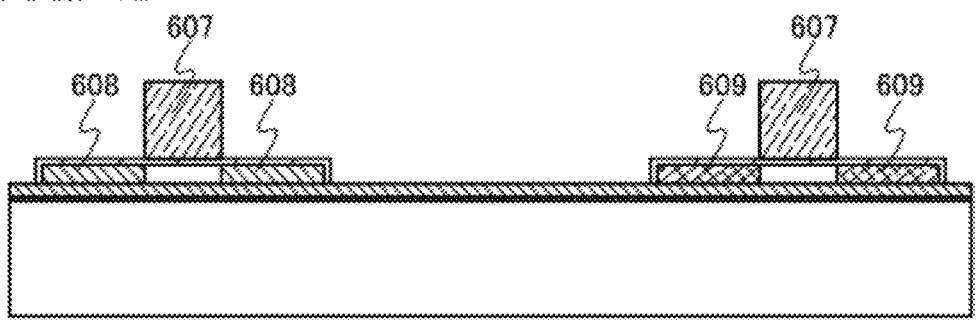

Subsequently, as shown in FIG. 4D, impurity elements imparting one conductivity type are added to the semiconductor films 602 and 603 by using the electrodes 607 as masks. In this embodiment, an impurity element imparting n-type conductivity (e.g., phosphorus or arsenic) is added to the semiconductor film 602, and an impurity element imparting p-type conductivity (e.g., boron) is added to the semiconductor film 603. Note that when the p-type impurity element is added to the semiconductor film 603, the semiconductor film 602 to which the n-type impurity element is added is covered with a mask or the like so that the p-type impurity element is added selectively. On the other hand, when the n-type impurity element is added to the semiconductor film 602, the semiconductor film 603 to which the p-type impurity element is added is covered with a mask or the like so that the n-type impurity element is added selectively. Alternatively, after adding an impurity element imparting one of p-type and n-type conductivity to the semiconductor films 602 and 603, an impurity element imparting the other conductivity may be added to only one of the semiconductor films 602 and 603 selectively at higher concentration than the previously added impurity element. By the addition of the impurity elements, impurity regions 608 are formed in the semiconductor film 602 and impurity regions 609 are formed in the semiconductor film 603.

Figure 5A:
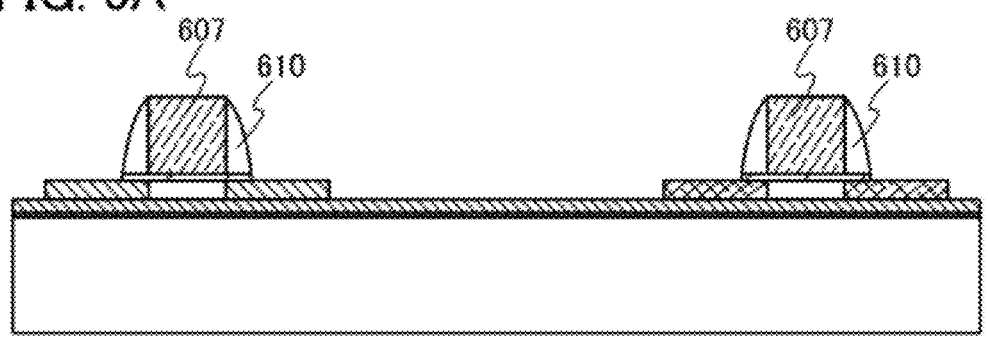
FIGS. 5A to 5C are diagrams illustrating a manufacturing method according to an embodiment of the present invention.

Subsequently, as shown in FIG. 5A, sidewalls 610 are formed on side surfaces of the electrodes 607. For example, the sidewalls 610 can be formed in such a manner that an insulating film is newly formed so as to cover the gate insulating films 604 and the electrodes 607, and the newly formed insulating film is partly etched by anisotropic etching by which etching is performed mainly in a perpendicular direction. By the anisotropic etching, the newly formed insulating film is partly etched to form the sidewalls 610 on the side surfaces of the electrodes 607. Note that the gate insulating films 604 may also be partly etched by the anisotropic etching. The insulating film for forming the sidewalls 610 may be a single layer or a stack of layers of a silicon film, a silicon oxide film, a silicon oxynitride film, a silicon nitride oxide film, or a film containing an organic material such as an organic resin formed by a plasma CVD method, a sputtering method, or the like. In this embodiment, a 100-nm-thick silicon oxide film is formed by a plasma CVD method. In addition, as an etching gas, a mixed gas of $CHF_3$ and helium can be used. Note that the steps of forming the sidewalls 610 are not limited to these.

Figure 5B:
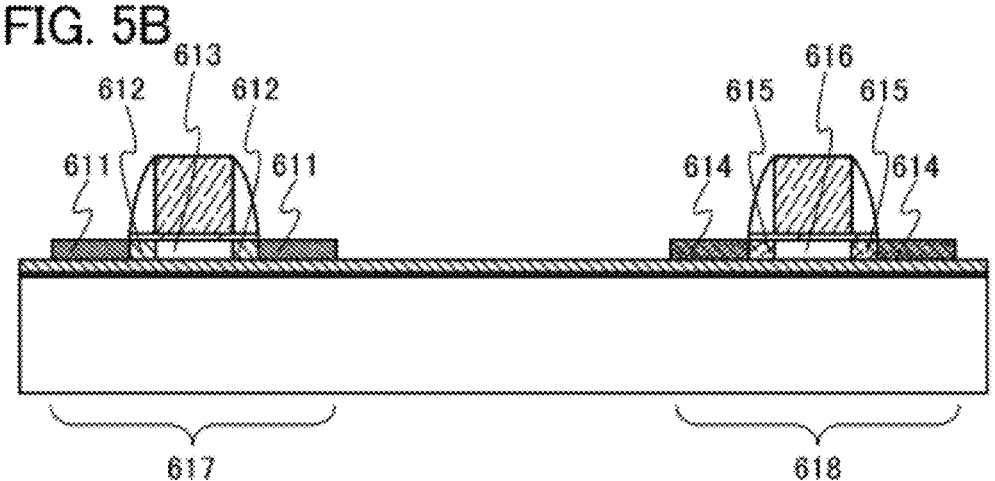

Next, as illustrated in FIG. 5B, an impurity element imparting one conductivity type is added to the semiconductor films 602 and 603 with the use of the electrodes 607 and the sidewalls 610 as masks. Note that the impurity element imparting the same conductivity type as the impurity element which has been added to the semiconductor films 602 and 603 in the previous step is added to the semiconductor films 602 and 603 at higher concentrations than that in the previous step. Note that when the p-type impurity element is added to the semiconductor film 603, the semiconductor film 602 to which the n-type impurity element is added is covered with a mask or the like so that the p-type impurity element is added selectively. On the other hand, when the n-type impurity element is added to the semiconductor film 602, the semiconductor film 603 to which the p-type impurity element is added is covered with a mask or the like so that the n-type impurity element is added selectively.

By the above-described addition of the impurity element, a pair of high-concentration impurity regions 611, a pair of low-concentration impurity regions 612, and a channel formation region 613 are formed in the semiconductor film 602. In addition, by the above-described addition of the impurity element, a pair of high-concentration impurity regions 614, a pair of low-concentration impurity regions 615, and a channel formation region 616 are formed in the semiconductor film 603. The high-concentration impurity regions 611 and 614 function as sources and drains, and the low-concentration impurity regions 612 and 615 function as LDD (lightly doped drain) regions.

Note that the sidewalls 610 formed over the semiconductor film 603 and the sidewalls 610 formed over the semiconductor film 602 may have either the same or different width in a direction where carriers move. The width of each sidewall 610 over the semiconductor film 603 which forms a p-type transistor is preferably larger than that over the semiconductor film 602 which forms an n-type transistor. This is because boron which is added for forming the source and the drain of the p-channel transistor easily diffuses so that a short channel effect is easily induced. When the width of the sidewall 610 of the p-channel transistor is made larger, boron can be added to the source and the drain at high concentration, and thus the resistance of the source and the drain can be decreased.

Next, a silicide layer may be formed by siliciding the semiconductor films 602 and 603 in order to further decrease the resistance of the sources and the drains. The siliciding is performed in such a manner that metal is brought into contact with the semiconductor films, and silicon in the semiconductor films is made to react with the metal by heat treatment such as a GRTA method or an LRTA method. Cobalt silicide or nickel silicide may be used as the silicide layer. In the case where the semiconductor films 602 and 603 are thin, the siliciding may be continued to the bottom of the semiconductor films 602 and 603 in this region. As a metal material used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Alternatively, a silicide layer may be formed by laser irradiation or light irradiation using a lamp or the like.

Through the above-described series of steps, an n-channel transistor 617 and a p-channel transistor 618 are formed.

Figure 5C:
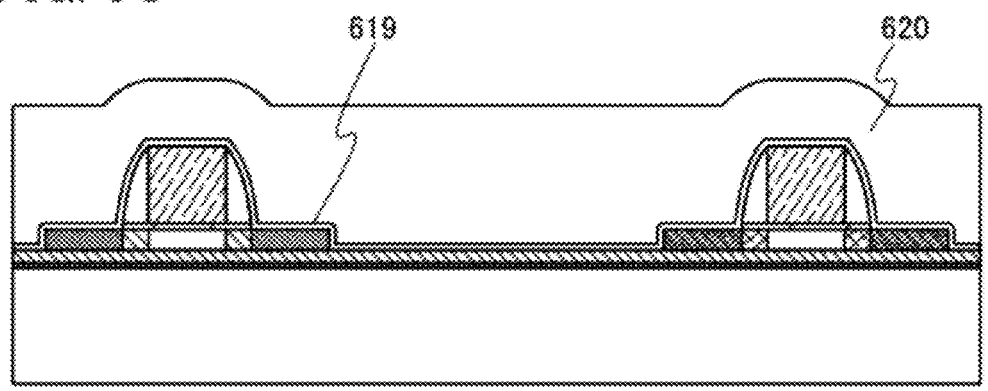

Next, an insulating film 619 is formed so as to cover the transistors 617 and 618, as shown in FIG. 5C. The insulating film 619 is not always necessary; however, the formation of the insulating film 619 can prevent impurities such as an alkali metal and an alkaline earth metal from entering the transistors 617 and 618. Specifically, it is desirable to use silicon nitride, silicon nitride oxide, silicon oxynitride, aluminum nitride, aluminum oxide, silicon oxide, or the like for the insulating film 619. In this embodiment, the insulating film 619 is formed using a silicon nitride oxide film with a thickness of approximately 600 nm In this case, the hydrogenation treatment described above may be performed after formation of the silicon nitride oxide film.

Next, an insulating film 620 is formed over the insulating film 619 so as to cover the transistors 617 and 618. An organic material having heat resistance, such as acrylic, polyimide, benzocyclobutene, polyamide, or epoxy can be used for the insulating film 620. Other than such organic materials, it is also possible to use a low-dielectric constant material (a low-k material), a siloxane-based resin, silicon oxide, silicon nitride, silicon nitride oxide, PSG (phosphosilicate glass), BPSG (borophosphosilicate glass), alumina, or the like. A siloxane-based resin may contain at least one of fluorine, an alkyl group, and aromatic hydrocarbon besides hydrogen as a substituent. Alternatively, the insulating film 620 may be formed by stacking plural insulating films formed of any of these materials. The insulating film 620 may have its surface flattened by a CMP method or the like.

Note that the siloxane-based resin corresponds to a resin including a Si—O—Si bond formed using a siloxane-based material as a starting material. The siloxane-based resin may have at least one of fluorine, an alkyl group, and an aromatic hydrocarbon besides hydrogen as a substituent.

For the formation of the insulating film 620, the following method can be used depending on the material of the insulating film 620: a method such as a CVD method, a sputtering method, an SOG method, spin coating, dipping, spray coating, or a droplet discharge method (e.g., an inkjet method, screen printing, or offset printing), or with a tool such as a doctor knife, a roll coater, a curtain coater, or a knife coater.

Figure 6:
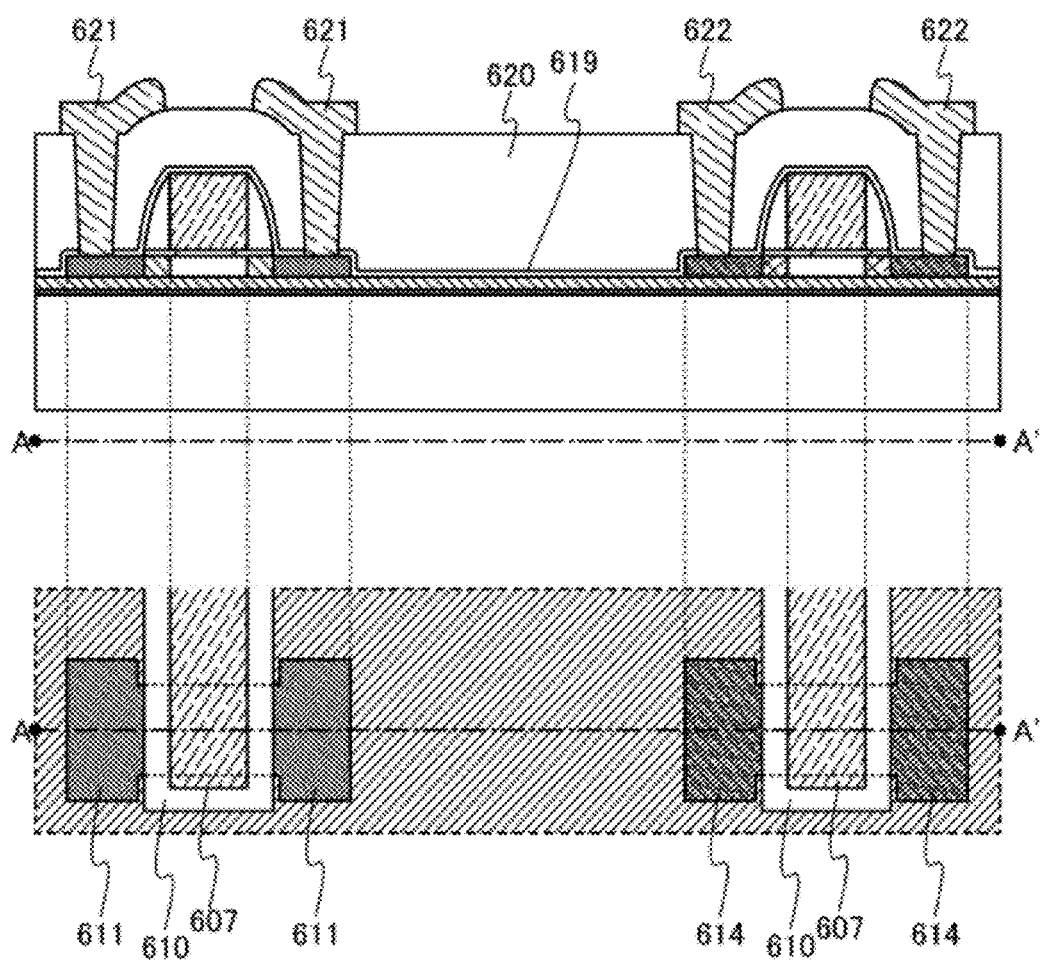
FIG. 6 is a diagram illustrating a manufacturing method according to an embodiment of the present invention.

Next, as illustrated in FIG. 6, contact holes are formed in the insulating film 619 and the insulating film 620 so that the semiconductor films 602 and 603 are partly exposed. Then, conductive films 621 and 622 are formed in contact with the semiconductor films 602 and 603, respectively through the contact holes. As an etching gas for forming the contact holes, a mixed gas of $CHF_3$ and He is employed; however, the present invention is not limited to this.

The conductive films 621 and 622 can be formed by a CVD method, a sputtering method, or the like. Specifically, the conductive films 621 and 622 can be formed of aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), or the like. Alternatively, an alloy containing the above-described metal as a main component or a compound containing the above-described metal may also be used. The conductive films 621 and 622 can be formed as a single layer or a stack of plural layers by using a film formed of any of the aforementioned metals.

Examples of an alloy containing aluminum as its main component include an alloy containing aluminum as its main component and also containing nickel. In addition, an alloy containing aluminum as its main component and also containing nickel and one of or both carbon and silicon can also be given as the example thereof. Since aluminum and aluminum silicon have low resistance values and are inexpensive, aluminum and aluminum silicon are suitable for forming the conductive films 621 and 622. In comparison with an aluminum film, an aluminum silicon film can particularly prevent the generation of hillock during resist baking at the time of patterning the conductive films 621 and 622. Cu may be mixed by approximately 0.5 wt % into an aluminum film instead of silicon (Si).

The conductive films 621 and 622 preferably employ, for example, a stacked layer structure of a barrier film, an aluminum silicon (Al—Si) film, and a barrier film, or a stacked layer structure of a barrier film, an aluminum silicon (Al—Si) film, a titanium nitride film, and a barrier film. Note that the barrier film refers to a film formed using titanium, a nitride of titanium, molybdenum, or a nitride of molybdenum. When barrier films are formed with an aluminum silicon film interposed therebetween, generation of a hillock of aluminum or aluminum silicon can be further prevented. Moreover, when the barrier film is formed of titanium which is a highly-reducible element, even if a thin oxide film is formed over the semiconductor films 602 and 603, the oxide film is reduced by titanium contained in the barrier film, whereby preferable contact between the conductive films 621 and 622 and the semiconductor films 602 and 603 can be obtained. Further, it is also possible to stack a plurality of barrier films. In that case, for example, a five-layer structure in which titanium, titanium nitride, aluminum silicon, titanium, and titanium nitride are stacked from the bottom can be used for the conductive films 621 and 622.

The conductive films 621 and 622 may be formed of tungsten silicide with the use of a $WF_6$ gas and a $SiH_4$ gas by a chemical vapor deposition method. Alternatively, the conductive films 621 and 622 may be formed of tungsten obtained by hydrogen reduction of $WF_6$.

Note that the conductive film 621 is connected to the high-concentration impurity region 611 of the n-channel transistor 617. The conductive film 622 is connected to the high-concentration impurity region 614 of the p-channel transistor 618.

FIG. 6 also illustrates a top view of the n-channel transistor 617 and the p-channel transistor 618. Note that the conductive films 621 and 622 and the insulating films 619 and 620 are omitted in this top view.

In addition, although the case where each of the n-channel transistor 617 and the p-channel transistor 618 includes one electrode 607 functioning as the gate is shown as an example in this embodiment, the present invention is not limited to this structure. The transistor included in the semiconductor device formed by the manufacturing method of the present invention may have a multi-gate structure in which a plurality of electrodes functioning as gates is electrically connected to one another.

Moreover, the transistor included in the semiconductor device formed by the manufacturing method of the present invention may have a gate planar structure.

Note that the semiconductor film of the SOI substrate is of almost single crystal. Therefore, variation in orientation is small as compared with a polycrystalline semiconductor film; accordingly, variation in threshold voltage of transistors can be decreased. Moreover, since a crystal grain boundary hardly exists unlike in a polycrystalline semiconductor film, it is possible to suppress leakage current caused by the crystal grain boundary and to achieve reduction in power consumption of a semiconductor device. In a polycrystalline semiconductor film obtained by laser crystallization, a surface of the semiconductor film tends to have a projection (ridge) due to distribution of energy density of a beam spot. However, the semiconductor film of the SOI substrate may be irradiated with laser light of low energy density to such a degree that defects in the semiconductor film caused by the attachment can be repaired. Accordingly, the semiconductor film of the SOI substrate has a much flatter surface than the polycrystalline semiconductor film obtained by laser crystallization and the thickness of the gate insulating film formed over the semiconductor film of the SOI substrate can be made small, approximately 5 nm to 50 nm. Thus, high on current can be obtained while suppressing gate voltage. In the case of using a polycrystalline semiconductor film obtained by laser crystallization, it is necessary to arrange the semiconductor films of transistors along a direction to which laser light is scanned, in order to achieve higher mobility. However, the semiconductor film of the SOI substrate is not restricted in arrangement; therefore, limit on design of semiconductor devices is reduced.

This embodiment can be implemented in combination with any of the above embodiments as appropriate.

Embodiment 4

Figure 7:
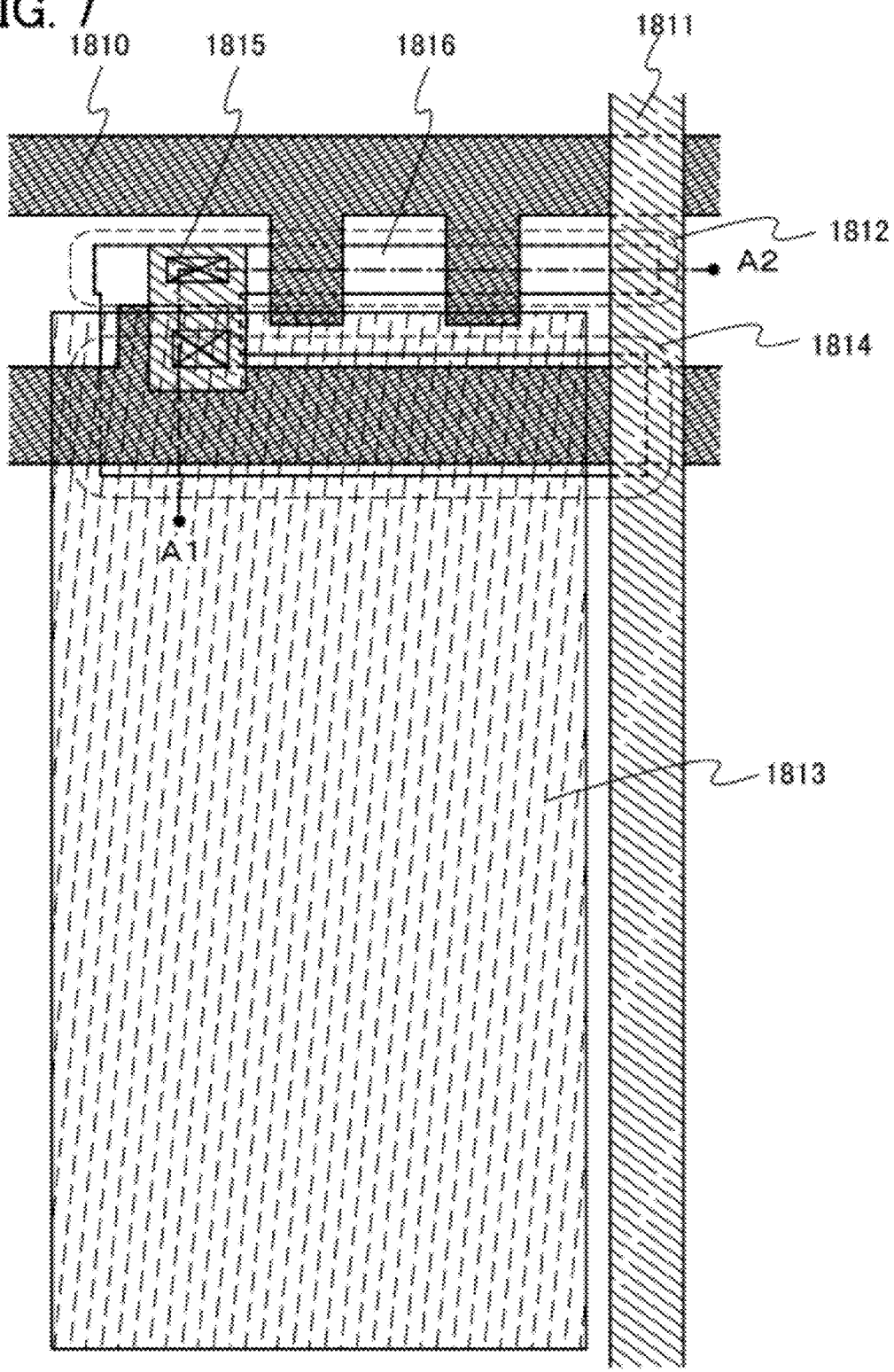
FIG. 7 is a top view of a pixel of a liquid crystal display device manufactured using the present invention.
Figure 8:
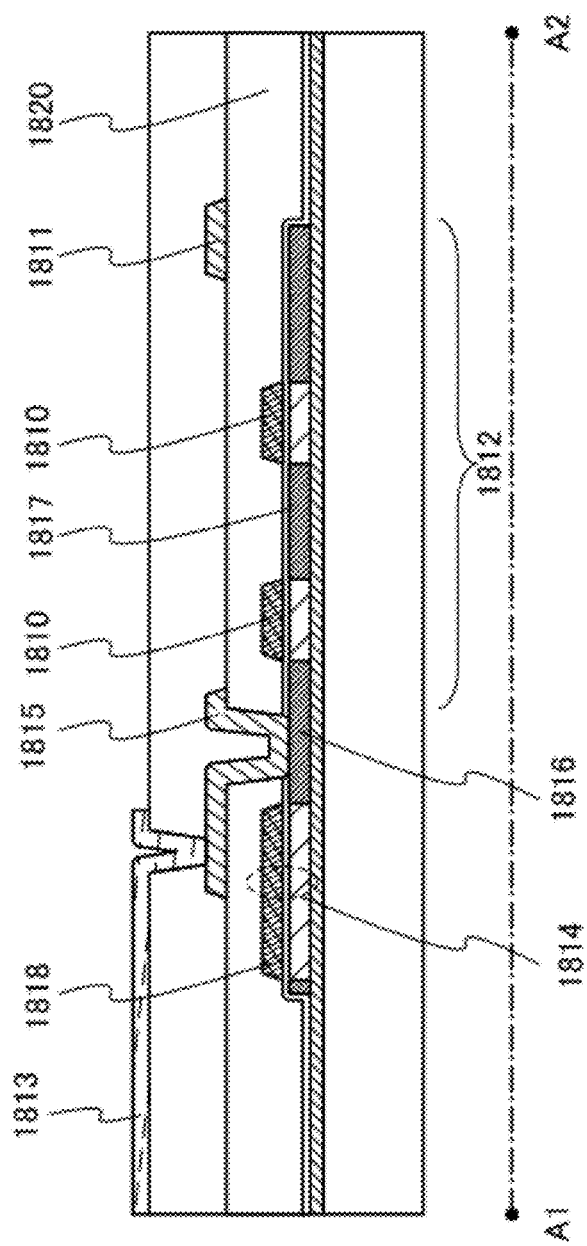
FIG. 8 is a cross-sectional view of a pixel of a liquid crystal display device manufactured using the present invention.

In this embodiment, a specific structure of a pixel in a liquid crystal display device which is formed by a method for manufacturing a semiconductor device of the present invention will be described. FIG. 7 illustrates an example of a top view of a pixel in a liquid crystal display device. FIG. 8 corresponds to a cross-sectional view taken along dashed line A1-A2 of the top view in FIG. 7.

The pixel illustrated in FIG. 7 and FIG. 8 includes at least a scanning line 1810, a signal line 1811, a transistor 1812 functioning as a switching element, a pixel electrode 1813, and a storage capacitor 1814 for storing voltage applied to a liquid crystal element. In addition, the pixel illustrated in FIG. 7 and FIG. 8 includes a wiring 1815 for electrically connecting the pixel electrode 1813, and the transistor 1812 and the storage capacitor 1814.

The transistor 1812 and the storage capacitor 1814 share a semiconductor film 1816. The semiconductor film 1816 can be formed in the following manner: a semiconductor film is formed by a method for manufacturing an SOI substrate according to an embodiment of the present invention; and then, the semiconductor film is processed (patterned) into a desired shape.

An insulating film 1817 is formed over the semiconductor film 1816, and a conductive film 1818 and the scanning line 1810 are formed over the insulating film 1817. The conductive film 1818 and the scanning line 1810 can be formed in such a manner that a conductive film formed over the insulating film 1817 is processed into a desired shape. Note that part of the scanning line 1810 functions as a gate electrode of the transistor 1812, and overlaps with the semiconductor film 1816. A portion where the conductive film 1818 overlaps with the semiconductor film 1816 with the insulating film 1817 interposed therebetween corresponds to the storage capacitor 1814.

The wiring 1815 and the signal line 1811 can be formed in the following manner: a conductive film is formed over an interlayer insulating film 1820 covering the storage capacitor 1814 and the transistor 1812; and then, the conductive film is processed into a desired shape.

Since the semiconductor film 1816 is formed by a method for manufacturing an SOI substrate according to an embodiment of the present invention, the semiconductor film 1816 has favorable crystallinity. Therefore, mobility of the transistor 1812 is increased, and on-current can be increased. In addition, since the semiconductor film 1816 is formed by a method for manufacturing an SOI substrate according to an embodiment of the present invention, the semiconductor film 1816 has high planarity. Therefore, decrease in withstand voltage due to, for example, reduction in thickness of part of the insulating film 1817 functioning as a gate insulating film of the transistor 1812 which is caused by unevenness of the semiconductor film 1816 can be prevented. As a result, the thickness of the gate insulating film can be reduced. Therefore, miniaturization of an element can be realized.

This embodiment can be implemented in combination with any of the above embodiments as appropriate.

Embodiment 5

In this embodiment, a procedure in the case of forming a plurality of semiconductor devices with the use of one base substrate will be described.

FIG. 9A is a perspective view in which a bond substrate 1801 is attached to a base substrate 1800. The attachment is performed by bonding the base substrate 1800 and an insulating film containing nitrogen atoms formed over the bond substrate 1801.

Next, as shown in FIG. 9B, the bond substrate 1801 is partly split, so that a semiconductor film 1802 which is part of the bond substrate 1801 is formed over the base substrate 1800.

Figure 10A:
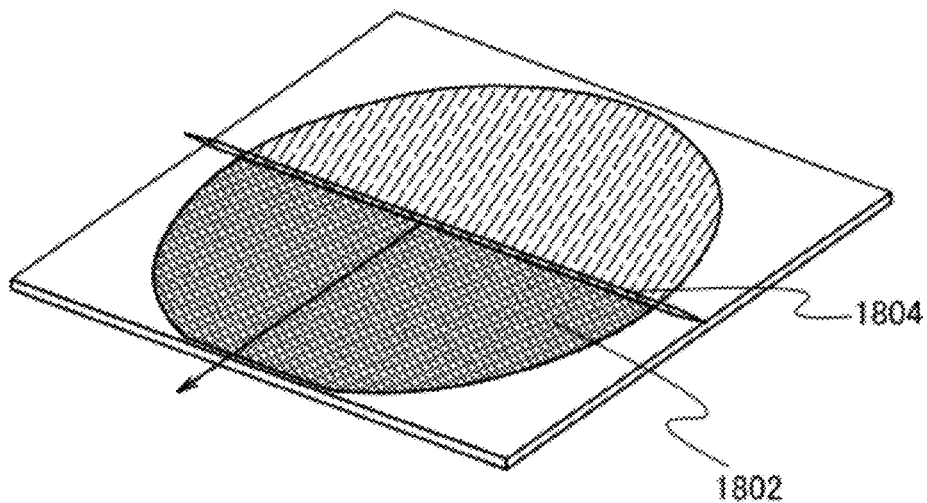
FIGS. 10A and 10B are diagrams illustrating a manufacturing method according to an embodiment of the present invention.

An oxide film such as a natural oxide film formed over the semiconductor film 1802 is removed, and then laser light irradiation is performed as shown in FIG. 10A. In the laser light irradiation, a beam spot 1804 is scanned in a direction indicated by an arrow, whereby improvement in crystallinity and planarity is achieved.

Figure 10B:
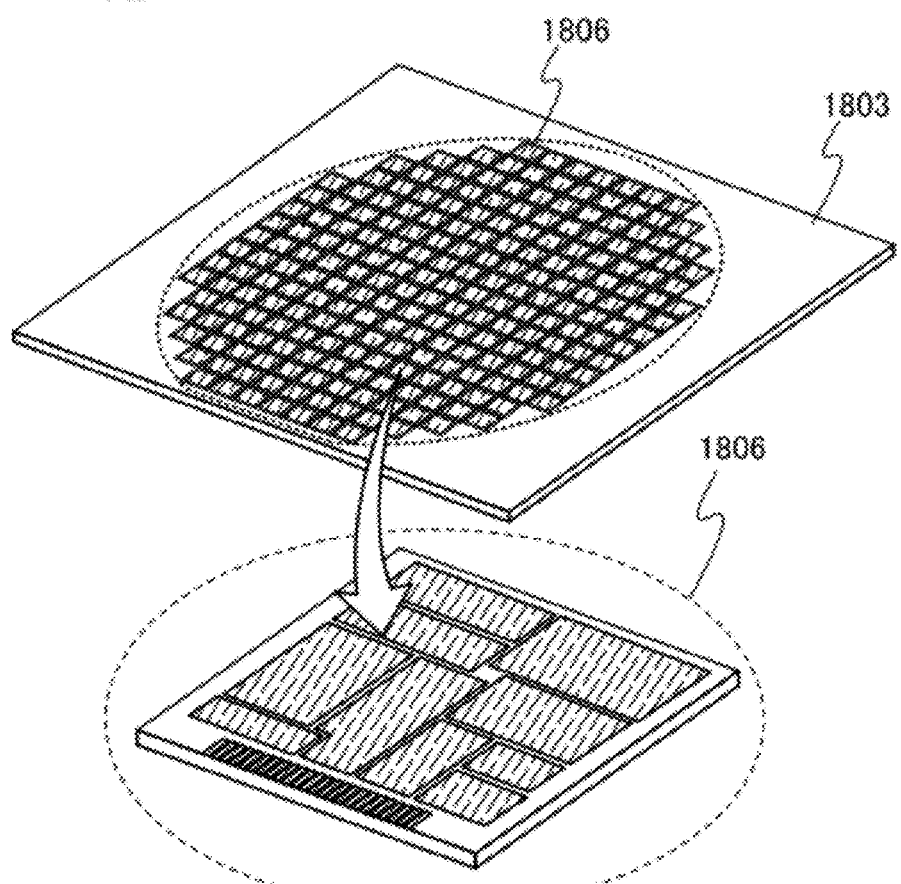

Next, as shown in FIG. 10B, a plurality of semiconductor devices 1806 is formed using the semiconductor film 1802 irradiated with the laser light in FIG. 10A, and the semiconductor devices 1806 including the base substrate 1800 are cut by dicing or the like. With the above structure, the plurality of semiconductor devices 1806 can be formed.

Although this embodiment describes the case of attaching a pair of the base substrate 1800 and the bond substrate 1801 to each other, the present invention is not limited to this structure. A plurality of bond substrates 1801 may be attached to one base substrate 1800.

This embodiment can be implemented in combination with any of the above embodiments as appropriate.

Embodiment 6

Figure 11A:
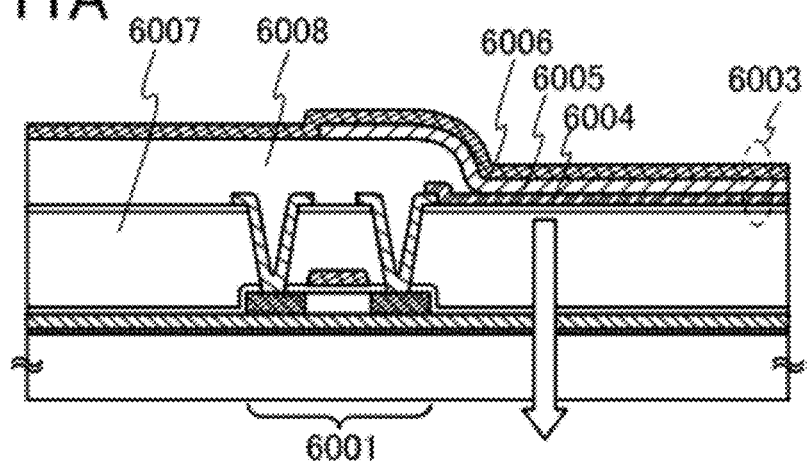
FIGS. 11A to 11C are cross-sectional views of a pixel of a light-emitting device manufactured using a manufacturing method according to an embodiment of the present invention.
Figure 11B:
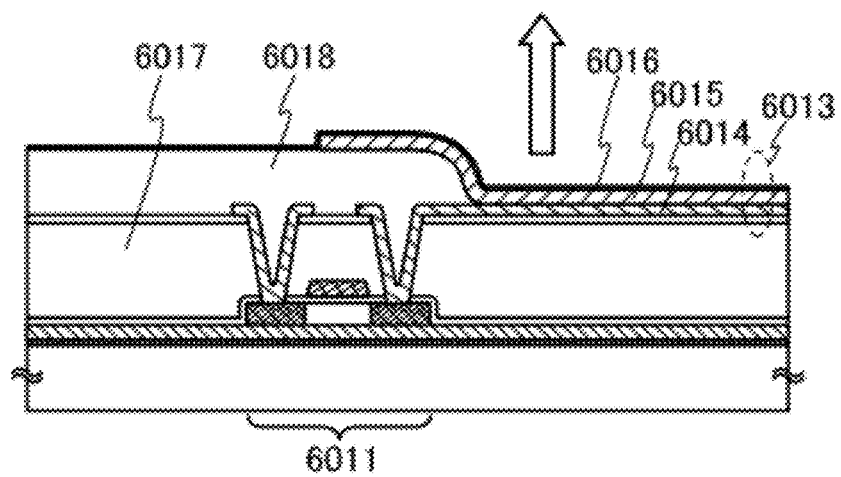
Figure 11C:
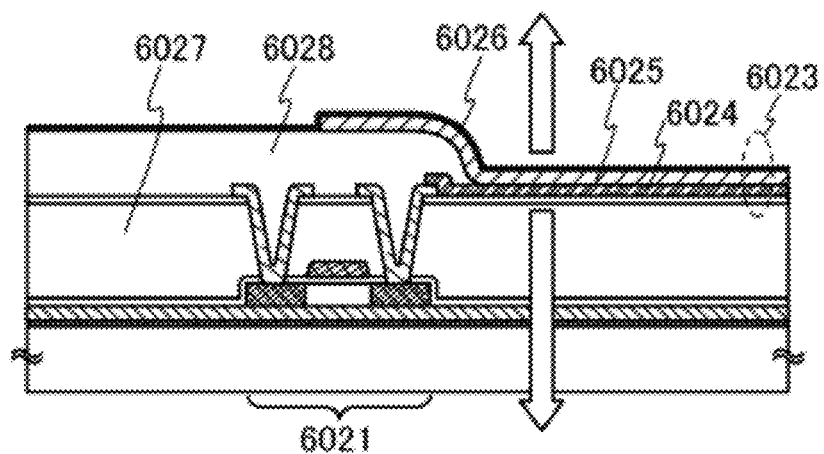

In this embodiment, a structure of a light-emitting device formed using a method for manufacturing a semiconductor device according to an embodiment of the present invention will be described. FIGS. 11A to 11C show examples of a cross-sectional structure of a pixel in the case where a transistor for driving a light-emitting element is p-channel type. Note that FIGS. 11A to 11C illustrate the case where a first electrode is an anode and a second electrode is a cathode; however, the first electrode may be a cathode and the second electrode may be an anode.

A cross-sectional view of a pixel in the case where a transistor 6001 is p-channel type, and light emitted from a light-emitting element 6003 is extracted from a first electrode 6004 side is illustrated in FIG. 11A.

The transistor 6001 is covered with an insulating film 6007, and a partition wall 6008 having an opening is formed over the insulating film 6007. In the opening of the partition wall 6008, the first electrode 6004 is partly exposed, and the first electrode 6004, an electroluminescent layer 6005, and a second electrode 6006 are sequentially stacked in the opening.

The first electrode 6004 is formed using such a material or to such a thickness as to have a light-transmitting property with respect to visible light, and using a material suitable for being used as an anode. For example, the first electrode 6004 can be formed using a light-transmitting oxide conductive material such as indium tin oxide (ITO), zinc oxide (ZnO), indium zinc oxide (IZO), gallium-doped zinc oxide (GZO), or oxide containing indium oxide, gallium oxide, and zinc oxide (IGZO: indium gallium zinc oxide). Alternatively, a mixture in which zinc oxide (ZnO) is mixed at 2% to 20% in ITO, indium tin oxide containing silicon oxide (hereinafter referred to as ITSO), or indium oxide containing silicon oxide may be used for the first electrode 6004 as well. Further alternatively, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the first electrode 6004. However, in the case of using a material other than the light-transmitting oxide conductive material, the first electrode 6004 is formed to such a thickness as to transmit light (preferably, approximately 5 nm to 30 nm).

The second electrode 6006 is formed using such a material or to such a thickness as to reflect or shield light, and can be formed using a material having a low work function of a metal, an alloy, an electrically conductive compound, a mixture thereof, or the like. Specifically, an alkaline metal such as Li or Cs, an alkaline earth metal such as Mg, Ca, or Sr, an alloy including such metals (for example, Mg:Ag, Al:Li, or Mg:In), a compound of such materials (for example, calcium fluoride or calcium nitride), or a rare-earth metal such as Yb or Er can be used. Further, in the case where an electron injection layer is provided, another conductive layer such as an aluminum layer may be used as well.

The electroluminescent layer 6005 is formed using a single layer or a plurality of layers. In the case where the electroluminescent layer 6005 is formed using a plurality of layers, the layers can be classified into layers such as a hole injection layer, a hole transport layer, a light-emitting layer, an electron transport layer, and an electron injection layer in terms of the carrier transporting properties. In the case where the electroluminescent layer 6005 includes at least one of the hole injection layer, the hole transport layer, the electron transport layer, and the electron injection layer in addition to the light-emitting layer, the hole injection layer, the hole transport layer, the light-emitting layer, the electron transport layer, and the electron injection layer are sequentially stacked over the first electrode 6004 in this order. Note that an interface between the layers is not necessarily clear, and there might be the case where materials forming the layers are partly mixed and the interface between the layers is unclear. Each layer can be formed using an organic-based material or an inorganic-based material. As the organic-based material, any of a high molecular weight organic material, a medium molecular weight organic material, and a low molecular weight organic material can be used. Note that the medium molecular weight material corresponds to a low polymer in which the number of repetitions of a structural unit (the degree of polymerization) is approximately 2 to 20. There is no clear distinction between the hole injection layer and the hole transport layer, and the hole injection layer and the hole transport layer are the same in terms of the point that the hole transport properties (hole mobility) are particularly important characteristics for both the hole injection layer and the hole transport layer. A layer in contact with the anode is referred to as a hole injection layer and a layer in contact with the hole injection layer is referred to as a hole transport layer for convenience. The same is also true for the electron transport layer and the electron injection layer. A layer in contact with the cathode is referred to as an electron injection layer and a layer in contact with the electron injection layer is referred to as an electron transport layer. In some cases, the light-emitting layer also serves as the electron transport layer, and it is therefore referred to as a light-emitting electron transport layer, too.

In the case of the pixel illustrated in FIG. 11A, light emitted from the light-emitting element 6003 can be extracted from the first electrode 6004 side as shown by a hollow arrow.

Next, a cross-sectional view of a pixel in the case where a transistor 6011 is p-channel type, and light emitted from a light-emitting element 6013 is extracted from a second electrode 6016 side is illustrated in FIG. 11B. The transistor 6011 is covered with an insulating film 6017, and a partition wall 6018 having an opening is formed over the insulating film 6017. In the opening of the partition wall 6018, a first electrode 6014 is partly exposed, and the first electrode 6014, an electroluminescent layer 6015, and the second electrode 6016 are sequentially stacked in the opening.

The first electrode 6014 is formed using such a material or to such a thickness as to reflect or shield light, and using a material suitable for being used as an anode. For example, a single-layer film containing one or more of titanium nitride, zirconium nitride, titanium, tungsten, nickel, platinum, chromium, silver, aluminum, and the like, a stacked layer of a titanium nitride film and a film containing aluminum as a main component, a three-layer structure of a titanium nitride film, a film containing aluminum as a main component, and a titanium nitride film, or the like can be used for the first electrode 6014.

The second electrode 6016 is formed using such a material or to such a thickness as to have a light-transmitting property with respect to visible light, and can be formed using a material having a low work function of a metal, an alloy, an electrically conductive compound, a mixture thereof, or the like. Specifically, an alkali metal such as Li or Cs, an alkaline earth metal such as Mg, Ca, or Sr, an alloy including such metals (for example, Mg:Ag, Al:Li, or Mg:In), a compound of such materials (for example, calcium fluoride or calcium nitride), or a rare-earth metal such as Yb or Er can be used. Further, in the case where an electron injection layer is provided, another conductive layer such as an aluminum layer can be used as well. Then, the second electrode 6016 is formed to such a thickness as to transmit light (preferably, approximately 5 nm to 30 nm). Note that the second electrode 6016 can be formed using a light-transmitting oxide conductive material such as indium tin oxide (ITO), zinc oxide (ZnO), indium zinc oxide (IZO), or gallium-doped zinc oxide (GZO). Furthermore, a mixture in which zinc oxide (ZnO) is mixed at 2% to 20% in ITO, ITSO, or indium oxide containing silicon oxide may be used as well. In the case of using the light-transmitting oxide conductive material, it is preferable to provide an electron injection layer in the electroluminescent layer 6015.

The electroluminescent layer 6015 can be formed in a manner similar to that of the electroluminescent layer 6005 of FIG. 11A.

In the case of the pixel illustrated in FIG. 11B, light emitted from the light-emitting element 6013 can be extracted from the second electrode 6016 side as shown by a hollow arrow.

Next, a cross-sectional view of a pixel in the case where a transistor 6021 is p-channel type, and light emitted from a light-emitting element 6023 is extracted from a first electrode 6024 side and a second electrode 6026 side is illustrated in FIG. 11C. The transistor 6021 is covered with an insulating film 6027, and a partition wall 6028 having an opening is formed over the insulating film 6027. In the opening of the partition wall 6028, the first electrode 6024 is partly exposed, and the first electrode 6024, an electroluminescent layer 6025, and the second electrode 6026 are sequentially stacked in the opening.

The first electrode 6024 can be formed in a manner similar to that of the first electrode 6004 of FIG. 11A. The second electrode 6026 can be formed in a manner similar to that of the second electrode 6016 of FIG. 11B. The electroluminescent layer 6025 can be formed in a manner similar to that of the electroluminescent layer 6005 of FIG. 11A.

In the case of the pixel illustrated in FIG. 11C, light emitted from the light-emitting element 6023 can be extracted from the first electrode 6024 side and the second electrode 6026 side as shown by hollow arrows.

This embodiment can be implemented in combination with any of the above embodiments as appropriate.

Embodiment 7

In this embodiment, a structure of a liquid crystal display device formed using a manufacturing method according to an embodiment of the present invention will be described.

Figure 12:
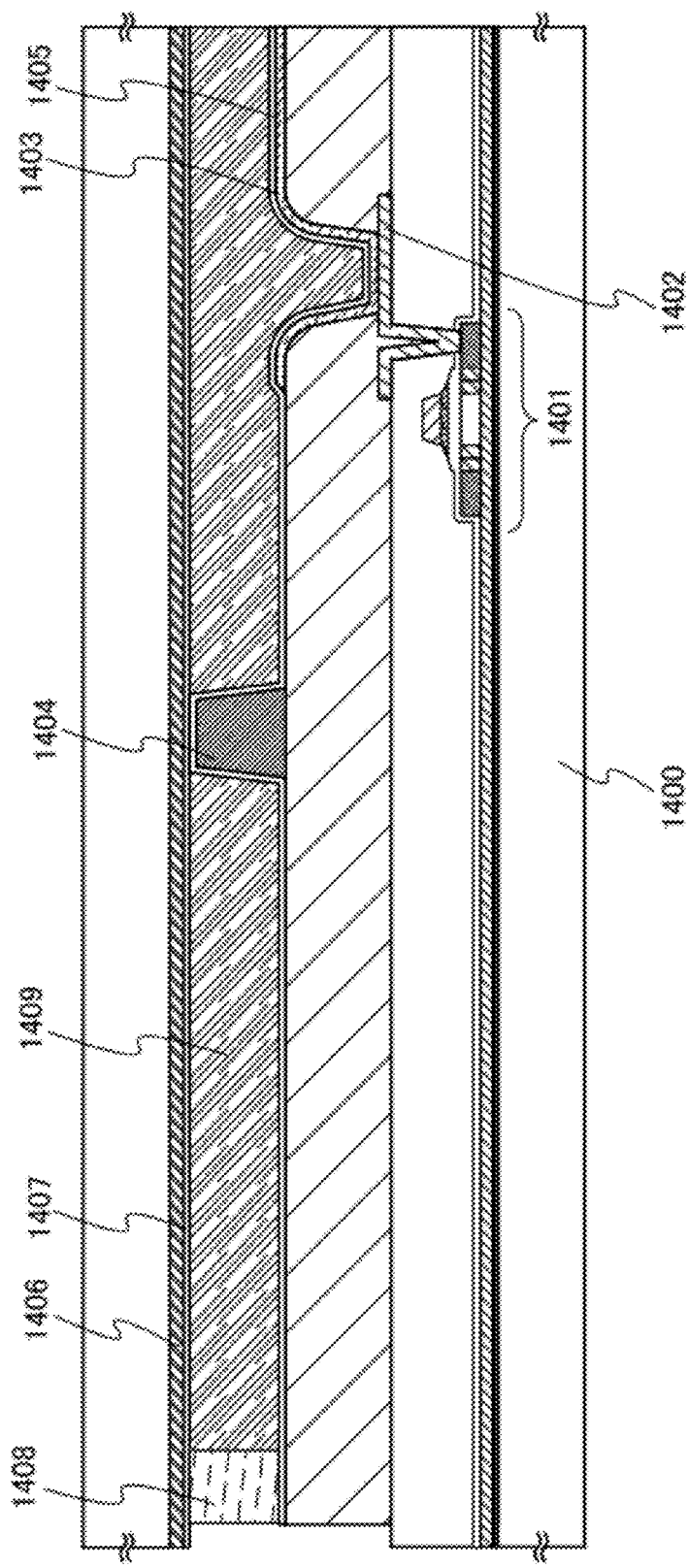
FIG. 12 is a cross-sectional view of a pixel of a liquid crystal display device manufactured using a manufacturing method according to an embodiment of the present invention.

FIG. 12 illustrates a cross-sectional view of a liquid crystal display device of the present invention as an example. A transistor 1401 over a substrate 1400 is electrically connected to a pixel electrode 1403 with a conductive film 1402 interposed therebetween.

Further, a spacer 1404 controls a cell gap of a liquid crystal element. An insulating film is etched to have a desired shape, so that the spacer 1404 can be formed. A cell gap may also be controlled with the use of a filler.

Then, an alignment film 1405 is formed over the pixel electrode 1403. The alignment film 1405 can be formed by subjecting an insulating film to rubbing treatment, for example. Further, a counter electrode 1406 is provided in a position opposed to the pixel electrode 1403, and an alignment film 1407 is formed on the side of the counter electrode 1406 which is close to the pixel electrode 1403. Furthermore, a liquid crystal 1409 is provided in a region which is surrounded by a sealant 1408 between the pixel electrode 1403 and the counter electrode 1406. Note that a filler may be mixed in the sealant 1408.

The pixel electrode 1403 and the counter electrode 1406 can be formed using a transparent conductive material such as indium tin oxide containing silicon oxide (ITSO), indium tin oxide (ITO), zinc oxide (ZnO), indium zinc oxide (IZO), or gallium-doped zinc oxide (GZO), for example. Note that this embodiment describes an example of manufacturing a transmissive type liquid crystal element by using a light-transmitting conductive film for the pixel electrode 1403 and the counter electrode 1406. However, the present invention is not limited to this structure. The liquid crystal display device according to an embodiment of the present invention may be a semi-transmissive type liquid crystal display device or a reflective type liquid crystal display device.

The liquid crystal display device illustrated in FIG. 12 may be provided with a color filter, a shielding film for preventing disclination (a black matrix), or the like.

Although a liquid crystal display device of a twisted nematic (TN) mode is described in this embodiment, the transistor of the present invention can be used for other liquid crystal display devices of a vertical alignment (VA) mode, an optically compensated birefringence (OCB) mode, an in-plane-switching (IPS) mode, and the like.

In the liquid crystal display device according to an embodiment of the present invention, a highly reliable thin film transistor with high mobility and on current is used; therefore, the liquid crystal display device according to an embodiment of the present invention has high contrast and high visibility.

This embodiment can be freely combined with any of the other embodiments.

Example 1

With the use of the manufacturing method according to an embodiment of the present invention, a semiconductor device including a highly reliable semiconductor element in which reduction in yield can be suppressed while deterioration in characteristics of the semiconductor element is suppressed can be formed. A semiconductor device formed by the manufacturing method of the present invention can be used for display devices, laptops, or image reproducing devices provided with recording media (typically, devices which reproduce the content of recording media such as digital versatile discs (DVDs) and have displays for displaying the reproduced images). Further, the electronic devices including the semiconductor device formed by the manufacturing method according to an embodiment of the present invention can be used for mobile phones, portable game machines, portable information terminals, e-book readers, cameras such as video cameras or digital still cameras, goggle-type displays (head mounted displays), navigation systems, audio reproducing devices (for example, car audio systems or digital audio players), copying machines, facsimiles, printers, versatile printers, automated teller machines (ATMs), vending machines, and the like. FIGS. 13A to 13E illustrate specific examples of these electronic devices.

Figure 13A:
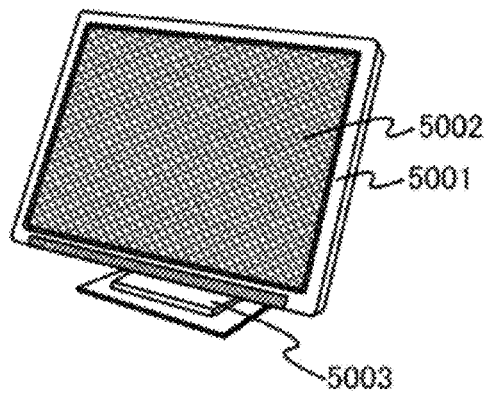
FIGS. 13A to 13E are diagrams each illustrating an electronic device including a semiconductor device.

FIG. 13A illustrates a display device including a housing 5001, a display portion 5002, a support base 5003, and the like. The semiconductor device formed by the manufacturing method according to an embodiment of the present invention can be used for the display portion 5002 or a signal processing circuit. By including the semiconductor device formed by the manufacturing method according to an embodiment of the present invention in the display portion 5002 or the signal processing circuit, a highly reliable display device can be provided. Note that the display device includes all of information display devices for personal computers, TV receivers, advertisement displays, and the like.

Figure 13B:
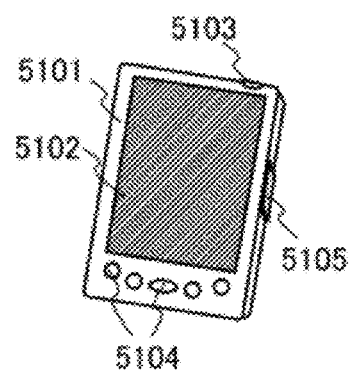

FIG. 13B illustrates a portable information terminal that includes a housing 5101, a display portion 5102, a switch 5103, operation keys 5104, an infrared port 5105, and the like. The semiconductor device formed by the manufacturing method according to an embodiment of the present invention can be used for the display portion 5102 or a signal processing circuit. With the use of the semiconductor device formed by the manufacturing method according to an embodiment of the present invention for the display portion 5102 or the signal processing circuit, a highly reliable portable information terminal can be provided.

Figure 13C:
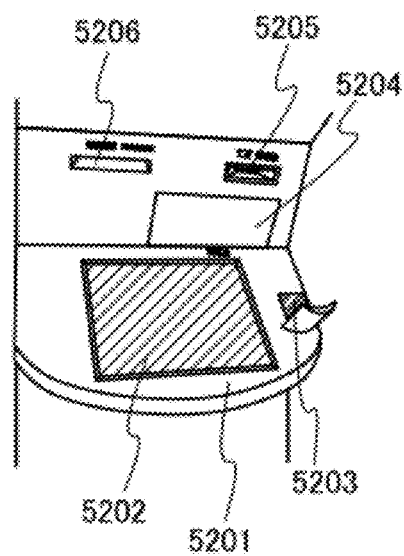

FIG. 13C illustrates an automated teller machine that includes a housing 5201, a display portion 5202, a coin slot 5203, a paper money slot 5204, a card slot 5205, a passbook slot 5206, and the like. The semiconductor device formed by the manufacturing method according to an embodiment of the present invention can be used for the display portion 5202 or a signal processing circuit. With the use of the semiconductor device formed by the manufacturing method according to an embodiment of the present invention for the display portion 5202 or the signal processing circuit, a highly reliable automated teller machine can be provided.

Figure 13D:
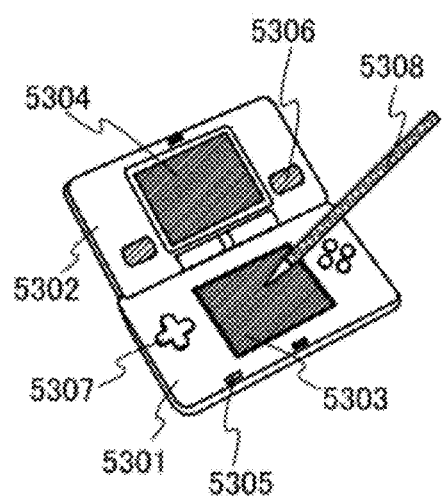

FIG. 13D illustrates a portable game machine including a housing 5301, a housing 5302, a display portion 5303, a display portion 5304, a microphone 5305, a speaker 5306, an operation key 5307, a stylus 5308, and the like. The semiconductor device formed by the manufacturing method according to an embodiment of the present invention can be used for the display portion 5303, the display portion 5304, or a signal processing circuit. The use of a semiconductor device formed by the manufacturing method according to an embodiment of the present invention for the display portion 5303, the display portion 5304, or the signal processing circuit can provide a highly reliable portable game machine. Although the portable game machine illustrated in FIG. 13D has the two display portions 5303 and 5304, the number of display portions included in the portable game machines is not limited thereto.

Figure 13E:
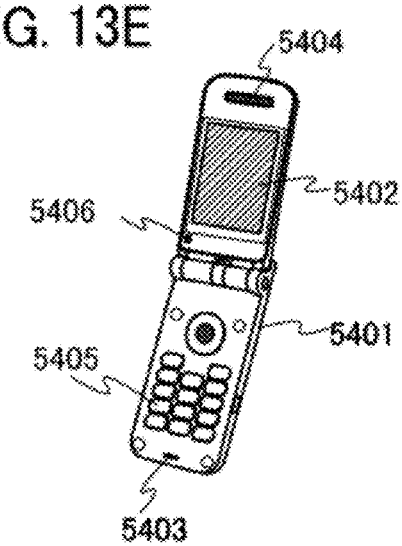

FIG. 13E illustrates a mobile phone including a housing 5401, a display portion 5402, an audio input portion 5403, an audio output portion 5404, operation keys 5405, a light receiving portion 5406, and the like. Light received in the light receiving portion 5406 is converted into electrical signals, whereby an outside image can be downloaded. The semiconductor device formed by the manufacturing method according to an embodiment of the present invention can be used for the display portion 5402 or a signal processing circuit. The use of a semiconductor device formed by the manufacturing method according to an embodiment of the present invention for the display portion 5402 or the signal processing circuit can provide a highly reliable mobile phone.

This example can be implemented in combination with any of the above embodiments as appropriate.

This application is based on Japanese Patent Application serial no. 2009-202281 filed with Japan Patent Office on Sep. 2, 2009, the entire contents of which are hereby incorporated by reference.

What is claimed is:

1. A method for manufacturing an SOI substrate, comprising the steps of:
    forming an oxide film over a single crystal semiconductor substrate by thermal oxidation;
    nitriding part of the oxide film by plasma nitridation to form an insulating film containing nitrogen atoms;
    attaching the single crystal semiconductor substrate and a base substrate to each other with the oxide film and the insulating film interposed therebetween; and
    splitting the single crystal semiconductor substrate to form a single crystal semiconductor film over the base substrate with the oxide film and the insulating film interposed therebetween.

2. The method for manufacturing an SOI substrate according to claim 1, wherein the base substrate is a glass substrate.

3. The method for manufacturing an SOI substrate according to claim 1, wherein the thermal oxidation is performed with use of oxygen and a halogen-containing gas selected from the group consisting of hydrogen chloride, hydrogen fluoride, nitrogen fluoride, hydrogen bromide, chlorine, chlorine fluoride, boron chloride, fluorine, and bromine.

4. The method for manufacturing an SOI substrate according to claim 1, wherein the insulating film is a silicon nitride film, a silicon oxynitride film, a silicon nitride oxide film, a germanium nitride film, a germanium oxynitride film, or a germanium nitride oxide film.

5. A method for manufacturing an SOI substrate, comprising the steps of:
    forming an oxide film with a thickness of 50 nm to 1100 nm over a single crystal semiconductor substrate by thermal oxidation;
    nitriding part of the oxide film by plasma nitridation to form an insulating film containing nitrogen atoms with a thickness of 3 nm to 20 nm;
    attaching the single crystal semiconductor substrate and a base substrate to each other with the oxide film and the insulating film interposed therebetween; and
    splitting the single crystal semiconductor substrate to form a single crystal semiconductor film over the base substrate with the oxide film and the insulating film interposed therebetween.

6. The method for manufacturing an SOI substrate according to claim 5, wherein the base substrate is a glass substrate.

7. The method for manufacturing an SOI substrate according to claim 5, wherein the thermal oxidation is performed with use of oxygen and a halogen-containing gas selected from the group consisting of hydrogen chloride, hydrogen fluoride, nitrogen fluoride, hydrogen bromide, chlorine, chlorine fluoride, boron chloride, fluorine, and bromine.

8. The method for manufacturing an SOI substrate according to claim 5, wherein the insulating film is a silicon nitride film, a silicon oxynitride film, a silicon nitride oxide film, a germanium nitride film, a germanium oxynitride film, or a germanium nitride oxide film.

9. A method for manufacturing an SOI substrate, comprising the steps of:
    forming an oxide film over a single crystal semiconductor substrate by thermal oxidation;
    nitriding part of the oxide film by plasma nitridation to form an insulating film containing nitrogen atoms;
    attaching the single crystal semiconductor substrate and a base substrate to each other with the oxide film and the insulating film interposed therebetween;
    splitting the single crystal semiconductor substrate to form a single crystal semiconductor film over the base substrate with the oxide film and the insulating film interposed therebetween; and
    irradiating the single crystal semiconductor film with laser light.

10. The method for manufacturing an SOI substrate according to claim 9, wherein the base substrate is a glass substrate.

11. The method for manufacturing an SOI substrate according to claim 9, wherein the thermal oxidation is performed with use of oxygen and a halogen-containing gas selected from the group consisting of hydrogen chloride, hydrogen fluoride, nitrogen fluoride, hydrogen bromide, chlorine, chlorine fluoride, boron chloride, fluorine, and bromine.

12. The method for manufacturing an SOI substrate according to claim 9, wherein the insulating film is a silicon nitride film, a silicon oxynitride film, a silicon nitride oxide film, a germanium nitride film, a germanium oxynitride film, or a germanium nitride oxide film.

13. The method for manufacturing an SOI substrate according to claim 9, wherein the single crystal semiconductor film is partly melted by the irradiation of the laser light.

14. The method for manufacturing an SOI substrate according to claim 9, wherein the oxide film has a thickness of 50 nm to 1100 nm, and wherein the insulating film has a thickness of 3 nm to 20 nm.

15. A method for manufacturing a semiconductor device, comprising the steps of:
    forming an oxide film over a single crystal semiconductor substrate by thermal oxidation;
    nitriding part of the oxide film by plasma nitridation to form an insulating film containing nitrogen atoms;
    attaching the single crystal semiconductor substrate and a base substrate to each other with the oxide film and the insulating film interposed therebetween;
    splitting the single crystal semiconductor substrate to form a single crystal semiconductor film over the base substrate with the oxide film and the insulating film interposed therebetween; and
    processing the single crystal semiconductor film into a desired shape.

16. The method for manufacturing a semiconductor device according to claim 15, wherein the base substrate is a glass substrate.

17. The method for manufacturing a semiconductor device according to claim 15, wherein the thermal oxidation is performed with use of oxygen and a halogen-containing gas selected from the group consisting of hydrogen chloride, hydrogen fluoride, nitrogen fluoride, hydrogen bromide, chlorine, chlorine fluoride, boron chloride, fluorine, and bromine.

18. The method for manufacturing a semiconductor device according to claim 15, wherein the insulating film is a silicon nitride film, a silicon oxynitride film, a silicon nitride oxide film, a germanium nitride film, a germanium oxynitride film, or a germanium nitride oxide film.

19. A method for manufacturing a semiconductor device, comprising the steps of:
    forming an oxide film with a thickness of 50 nm to 1100 nm over a single crystal semiconductor substrate by thermal oxidation;
    nitriding part of the oxide film by plasma nitridation to form an insulating film containing nitrogen atoms with a thickness of 3 nm to 20 nm;
    attaching the single crystal semiconductor substrate and a base substrate to each other with the oxide film and the insulating film interposed therebetween;
    splitting the single crystal semiconductor substrate to form a single crystal semiconductor film over the base substrate with the oxide film and the insulating film interposed therebetween; and
    processing the single crystal semiconductor film into a desired shape.

20. The method for manufacturing a semiconductor device according to claim 19, wherein the base substrate is a glass substrate.

21. The method for manufacturing a semiconductor device according to claim 19, wherein the thermal oxidation is performed with use of oxygen and a halogen-containing gas selected from the group consisting of hydrogen chloride, hydrogen fluoride, nitrogen fluoride, hydrogen bromide, chlorine, chlorine fluoride, boron chloride, fluorine, and bromine.

22. The method for manufacturing a semiconductor device according to claim 19, wherein the insulating film is a silicon nitride film, a silicon oxynitride film, a silicon nitride oxide film, a germanium nitride film, a germanium oxynitride film, or a germanium nitride oxide film.

23. A method for manufacturing a semiconductor device, comprising the steps of:
    forming an oxide film over a single crystal semiconductor substrate by thermal oxidation;
    nitriding part of the oxide film by plasma nitridation to form an insulating film containing nitrogen atoms;
    attaching the single crystal semiconductor substrate and a base substrate to each other with the oxide film and the insulating film interposed therebetween;
    splitting the single crystal semiconductor substrate to form a single crystal semiconductor film over the base substrate with the oxide film and the insulating film interposed therebetween;
    irradiating the single crystal semiconductor film with laser light; and
    processing the single crystal semiconductor film into a desired shape.

24. The method for manufacturing a semiconductor device according to claim 23, wherein the base substrate is a glass substrate.

25. The method for manufacturing a semiconductor device according to claim 23, wherein the thermal oxidation is performed with use of oxygen and a halogen-containing gas selected from the group consisting of hydrogen chloride, hydrogen fluoride, nitrogen fluoride, hydrogen bromide, chlorine, chlorine fluoride, boron chloride, fluorine, and bromine.

26. The method for manufacturing a semiconductor device according to claim 23, wherein the insulating film is a silicon nitride film, a silicon oxynitride film, a silicon nitride oxide film, a germanium nitride film, a germanium oxynitride film, or a germanium nitride oxide film.

27. The method for manufacturing a semiconductor device according to claim 23, wherein the single crystal semiconductor film is partly melted by the irradiation of the laser light.

28. The method for manufacturing a semiconductor device according to claim 23, wherein the oxide film has a thickness of 50 nm to 1100 nm, and wherein the insulating film has a thickness of 3 nm to 20 nm.

* * * * *